(12) United States Patent
Azuma et al.

(10) Patent No.: US 7,855,593 B2
(45) Date of Patent: Dec. 21, 2010

(54) SEMICONDUCTOR INTEGRATED CIRCUIT DEVICE

(75) Inventors: Yuri Azuma, Sayama (JP); Yoshihiko Yasu, Kodaira (JP); Yasuto Igarashi, Higashimurayama (JP); Takashi Kuraishi, Chofu (JP); Kazumasa Yanagisawa, Kokubunji (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/497,982

(22) Filed: Jul. 6, 2009

(65) Prior Publication Data

US 2009/0267686 A1    Oct. 29, 2009

Related U.S. Application Data

(63) Continuation of application No. 11/109,660, filed on Apr. 20, 2005, now abandoned.

(30) Foreign Application Priority Data

Apr. 20, 2004    (JP)    .............. 2004-124683

(51) Int. Cl.
*G05F 1/10*    (2006.01)
*G05F 3/02*    (2006.01)

(52) U.S. Cl. .................................... 327/544

(58) Field of Classification Search .......... 327/544–546
See application file for complete search history.

(56) References Cited

U.S. PATENT DOCUMENTS 5,614,847 A    3/1997    Kawahara et al.
6,114,903 A    9/2000    Bach
6,888,395 B2    5/2005    Mizuno et al.
7,161,414 B2    1/2007    Mizuno
2003/0025529 A1*    2/2003    Bailey .......................... 326/93

FOREIGN PATENT DOCUMENTS

JP    2002-026711    1/2002
JP    2003-218682    7/2003

* cited by examiner

*Primary Examiner*—Quan Tra
(74) *Attorney, Agent, or Firm*—Antonelli, Terry, Stout & Kraus, LLP.

(57) ABSTRACT

A semiconductor integrated circuit device enhanced in design efficiency while achieving multi-functionalization and power saving is to be provided. The semiconductor integrated circuit device has first through third circuit blocks, and is placed in a first power supply state in which the operation of internal circuits in the first circuit block is guaranteed in accordance with an instruction from the third circuit block or a second power supply state in which the operation of the internal circuits is not guaranteed. The second circuit block has an input unit which receives signals supplied from the first circuit block, and the input unit of the second circuit block has an input circuit which, in accordance with a control signal sent from said third circuit block to said second circuit block, causes a specific signal level to be maintained in compliance with the operating voltage of the second circuit block irrespective of the signal supplied from the first circuit block when the third circuit block instructs the second power supply state to the first circuit block.

1 Claim, 17 Drawing Sheets

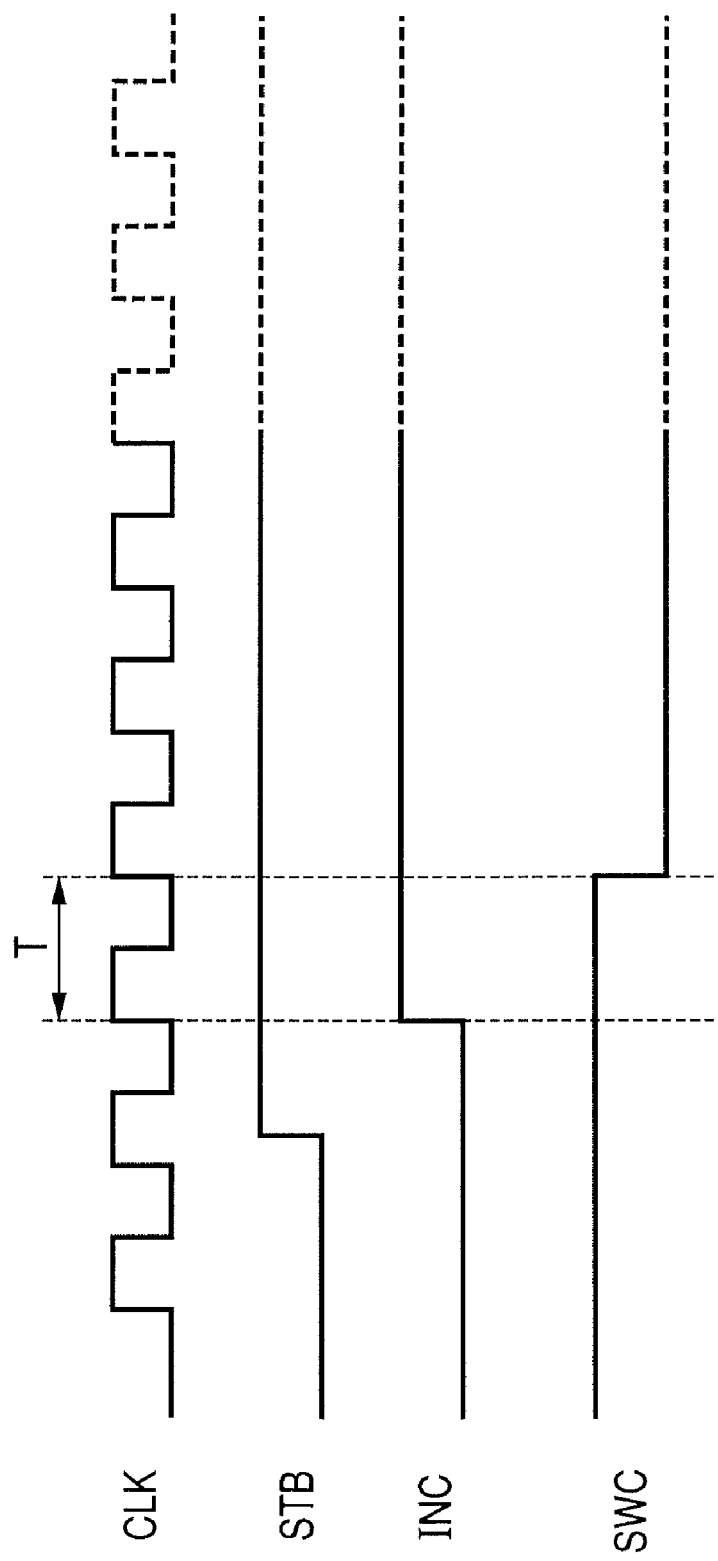

SEMICONDUCTOR INTEGRATED CIRCUIT DEVICE

CROSS REFERENCE TO RELATED APPLICATION

This application is a continuation of U.S. application Ser. No. 11/109,660, filed Apr. 20, 2005 now abandoned, and which application claims priority from Japanese patent application No. 2004-124683 filed on Apr. 20, 2004, the contents of which are hereby incorporated by reference into this application.

BACKGROUND OF THE INVENTION

The present invention relates to a semiconductor integrated circuit device, and more particularly to a technique that can be effectively applied to, for instance, a system large scale integrated circuit (LSI) in which each of a plurality of functional modules is divided into circuit blocks and power supplied is turned on or off according to the operation or non-operation of each functional module.

There is Japanese Unexamined Patent Publication No. 2002-026711, which discloses a configuration in which the circuit is divided into a circuit block consisting of a MOSFET having a low threshold voltage and a circuit block consisting of a MOSFET having a high threshold voltage, the leak current is reduced by cutting off power supply to the circuit blocks of the low threshold voltage in the standby mode when the semiconductor integrated circuit device is not operating, and a gate circuit known as a wrapper is provided on the route on which its input signals and output signals are communicated. Also, the existence of Japanese Unexamined Patent Publication No. 2003-218682 is reported, which discloses a configuration comprising a sending-side circuit block having a power switch, a receiving-side circuit block, and a micro I/O circuit for supplying output signals from the sending-side circuit block to the receiving-side circuit block as input signals, in which the micro I/O circuit prevents the output signals from being propagated with a control signal from the receiving-side circuit block when power supply to the sending-side circuit block is cut off by the power switch. However neither of these patent references makes any mention of technical problems the invention under this application intends to solve.

[Patent Reference 1] Japanese Unexamined Patent Publication No. 2002-026711

[Patent Reference 2] Japanese Unexamined Patent Publication No. 2003-218682

SUMMARY OF THE INVENTION

According to Patent Reference 1, the whole LSI is divided into a low-threshold voltage circuit block and a high-threshold voltage circuit block and a leak current is reduced by cutting off power supply to the low-threshold voltage circuit block when the LSI is in the standby mode. Therefore, where a plurality of functions are mounted on a single semiconductor integrated circuit device as in a system LSI and there are both operating functional blocks and non-operating functional blocks, the above-stated technique of power saving by cutting off power supply to non-operating functional blocks cannot be applied. On the other hand, Patent Reference 2 discloses a configuration in which the circuit is divided into functional blocks, and power supply to standing-by circuit blocks is cut off. However, this configuration requires a special circuit block to connect the two circuit blocks, i.e. the micro I/O circuit, to prevent the through current, which would arise in the circuit block to which power is supplied as a result of the floating of the output signals of the circuit block to which power supply has been cut off. This is also true of the configuration according to Patent Reference 1, wherein the low-threshold voltage circuit block to which power supply is cut off is provided with circuit blocks known as an output wrapper and an input wrapper.

These configurations in which are arranged, apart from circuit blocks to perform the essential functions of the circuit, circuit blocks which prevent unfixed signals in the circuit block to which power supply has been cut off is prevented from being transmitted to the circuit block to which power is supplied, such as the wrapper and the micro I/O circuit, involve a problem of increased man-hours spent on the designing of circuit block arrangement for that purpose. Especially the configuration according to Patent Reference 2 involves a problem of requiring different ways of control to match four cases of power cut-off, as stated in paragraph 0020 of the specification, because where the micro I/O circuit has a level changing function, the earlier stage is supplied with the same source voltage as the sending-side circuit block and the later stage is supplied with the same source voltage as the receiving-side circuit block, with the consequence that one circuit block is supplied with a common source voltage to a different circuit block.

An object of the present invention is to provide a semiconductor integrated circuit device which achieves multi-functionalization and power saving with a simple configuration. Another object of the invention is to provide semiconductor integrated circuit device enhanced in design efficiency while achieving multi-functionalization and power saving. The aforementioned and other objects and novel features of the invention will become apparent from the following description in this specification when taken in conjunction with the accompanying drawings.

To briefly describe a typical aspect of the invention disclosed in the present application, the semiconductor integrated circuit device has first through third circuit blocks, wherein the first circuit block has a first power supply state in which the operation of internal circuits is guaranteed in accordance with an instruction from the third circuit block and a second power supply state in which the operation of the internal circuits is not guaranteed, the second circuit block has an input unit which receives signals supplied from the first circuit block, and the input unit of the second circuit block has an input circuit which, in accordance with the control signal which was responded to when the second power supply state was instructed by the third circuit block to the first circuit block, causes a specific signal level to be maintained in compliance with the operating voltage of the second circuit block irrespective of the signal supplied from the first circuit block.

With a simple configuration, inputs at unfixed levels to a circuit block in an operating state can be prevented while saving power consumption by interrupting power supply to a standing-by circuit block. The control signal for the prevention of inputs at unfixed levels can be easily generated and matched with power cut-off control.

BRIEF DESCRIPTION OF THE DRAWINGS

FIG. 2 is a timing chart illustrating the operation of the circuit block 3 in FIG. 1.

DETAILED DESCRIPTION OF THE PREFERRED EMBODIMENTS

Figure 1A:
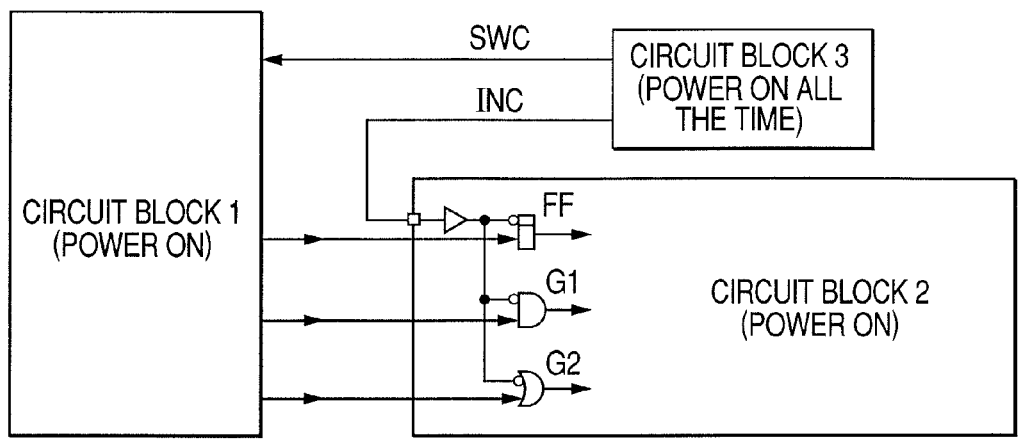
FIGS. 1(A) and 1(B) show the configurations of the smallest unit of a semiconductor integrated circuit device, which is a preferred embodiment of the present invention.
Figure 1B:
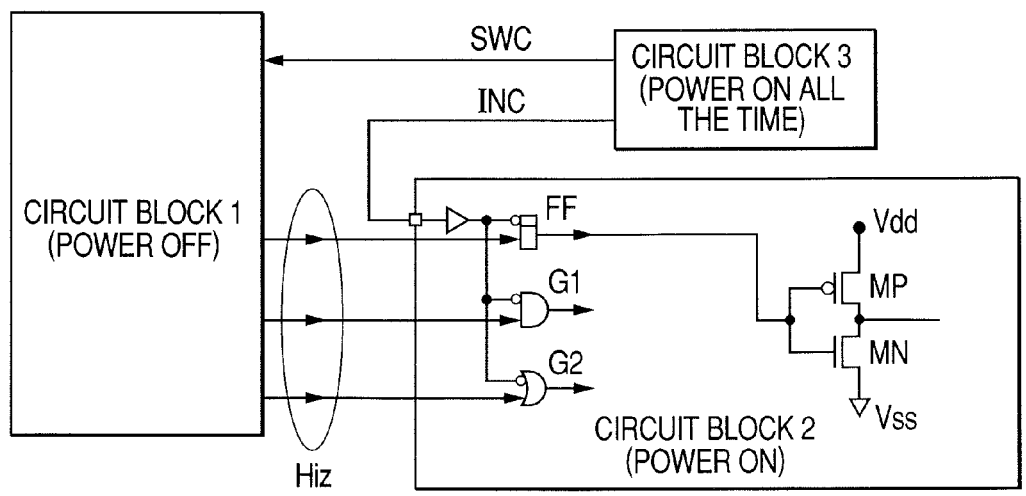

FIG. 1 show the configurations of the smallest unit of a semiconductor integrated circuit device, which is a preferred embodiment of the present invention. FIG. 1(A) shows one example of one type of operating state, and FIG. 1(B), one example of another type of operating state. The smallest unit of the semiconductor integrated circuit device of this embodiment consists of three circuit blocks. A circuit block 1, turned off in a standby state, is provided with a power switch. A circuit block 2 has a circuit portion which operates in response to a signal from the circuit block 1. The presence or absence of the function of turning off when standing by is irrelevant to the circuit block 2. The circuit block 1 is provided with a circuit block 3 which generates a control signal SWC for power supply control and a control signal INC for preventing propagation of unfixed levels from a circuit block to which power supply is turned off. Power supply to this circuit block 3 is on all the time. An input circuit for receiving signals from the circuit block 1 is provided in the circuit block 2. The input circuit is composed, as its illustrative example, of logical gate circuits including a latch circuit FF, a NAND circuit G1 and a NOR circuit C2.

Referring to FIG. 1(A), both of the circuit blocks 1 and 2 are placed in an operating state. Thus, the power supply control signal SWC transmitted from the circuit block 3 causes power to be supplied to the circuit block 1. The control signal INC for preventing propagation of unfixed levels transmitted from the circuit block 3 causes the input circuit provided in the circuit block 2 to capture signals transmitted from the circuit block 1.

Referring to FIG. 1(B), the circuit block 1 is placed in a non-operating state, and the circuit block 2 is placed in an operating state. Thus, the power supply control signal SWC transmitted from the circuit block 3 cuts off power supply to the circuit block 1. The control signal INC for preventing propagation of unfixed levels transmitted from the circuit block 3 causes the input circuit provided in the circuit block 2 forbids communication of the unfixed level (Hiz: high output impedance state) transmitted from the circuit block 1, and causes a fixed level matching the control signal INC to be transmitted to internal circuits. This prevents through currents due to unfixed levels from arising in the circuit block 2 in operation, and prevents the circuit block 2 from being caused to operate erroneously by any input of an unfixed level. In other words, the circuit block 2 is enabled to realize its signal processing, which is its essential function.

FIG. 2 is a timing chart illustrating the operation of the circuit block 3 in FIG. 1. The circuit block 3, though not illustrated in FIG. 1, generates the control signal SWC for controlling power supply to the circuit block 1 in response to a clock signal CLK, such as a system clock, and a standby signal STB, and the control signal INC for preventing propagation of unfixed levels in the circuit block 2. When the standby signal STB is generated, the circuit block 3 deciphers that signal, thereby determines the circuit block 1 to be in a standby state, and transmits the control signal INC for preventing propagation of unfixed levels to the circuit block 2 in synchronism with the clock pulse CLK. Thus, in response to the high level of the control signal INC, the □ input circuit of the circuit block 2 forbids signal communication from the circuit block 1, and forms a fixed level conforming to the control signal INC. After that, the control signal SWC for power supply control varies from the high to low level in synchronism with the clock pulse CLK, the power switch in the circuit block 1 is turned off to cut off power supply to the circuit block 1.

Figure 3:
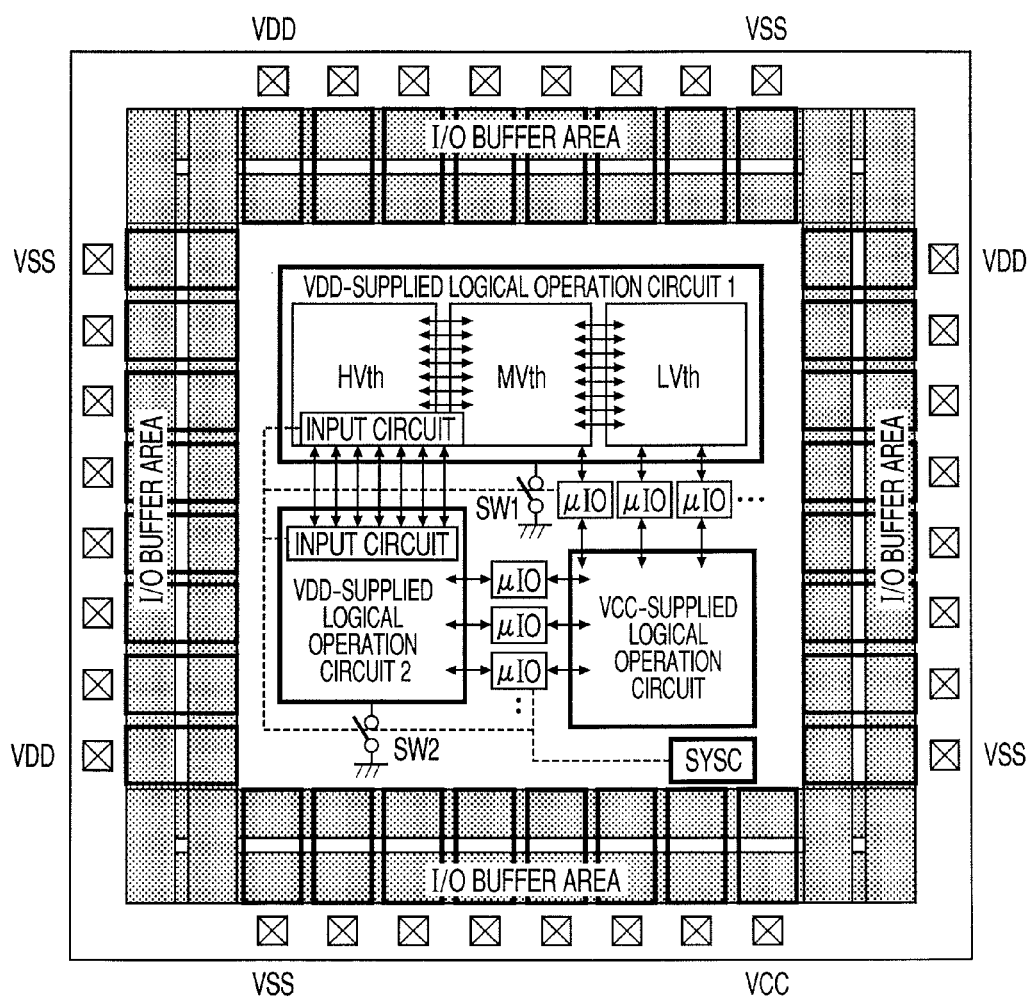
FIG. 3 is an overall block diagram of a semiconductor integrated circuit device, which is a preferred embodiment of the invention.

FIG. 3 is an overall block diagram of a semiconductor integrated circuit device, which is a preferred embodiment of the invention. In this drawing, the semiconductor integrated circuit device is shown to operate on two source voltages VCC and VDD, though this is not the only possible configuration. The source voltage VCC is relatively high, such as 3.3

V, and the source voltage VDD is relatively low, such as 1.2 V, though again these are not absolutely required. The relatively high source voltage VCC and a ground potential VSS matching it are supplied to an input/output (I/O) buffer and a VCC-supplied logical circuit disposed in the peripheries of the chip. The relatively low source voltage VDD and a round potential VSS matching it are supplied to the VDD-supplied logical operation circuits 1 and 2 and a power supply control circuit SYSC. The VDD-supplied logical operation circuits 1 and 2 are supplied with power switches SW1 and SW2. Unlike them, the VCC-supplied logical operation circuit has no such power switch, but is supplied with the source voltage VCC and the ground potential VSS all the time. The power supply control circuit SYSC is also supplied with the source voltage VDD and the ground potential VSS all the time.

The VDD-supplied logical circuits 1 and 2 are configured of MOSFETs of a high threshold voltage HVth, a medium threshold voltage MVth and a low threshold voltage LVth, though this is no absolute requirement. For instance, a circuit to receive signals transmitted from other circuit blocks usually need not operate at very high speed, and therefore is configured of a MOSFET having a high threshold voltage HVth. Each internal circuit is configured of a combination of MOSFETs having a medium MVth or LVth according to its speed requirement. Thus, while MOSFETs having a low threshold LVth are used on a signal transmission path where there are many logical steps because the delay time per logical step should be reduced, MOSFETs having a medium threshold voltage MVth are used on a signal transmission path where the number of logical steps is moderate because the delay time per logical step need not be so short, and MOSFETs of a high threshold voltage HVth are used on a signal transmission path where the number of logical steps is small because the delay time per logical step can be long.

When signals are to be communicated between the VDD-supplied logical operation circuit 1 or 2 and the VCC-supplied logical circuit, there is provided a micro input/output circuit μIO for level conversion to convert VDD-supplied small amplitude signals into VCC-supplied large amplitude signals. Since power is supplied all the time to the VCC-supplied logical circuit in this embodiment as stated above, this conversion is used for preventing propagation of unfixed levels by utilizing the micro input/output circuit μIO when power supply to the VDD-supplied logical operation circuit 1 or 2 is cut off. For this reason, the control signals SWC and INC formed by the power supply control circuit SYSC are delivered to the respective power switches SW1 and SW2 of the VDD-supplied logical operation circuits 1 and 2 and the input circuit as indicated by dotted lines in the diagram. The control signal INC is also delivered to the micro input/output circuit (IO as will be described afterwards.

Figure 4:
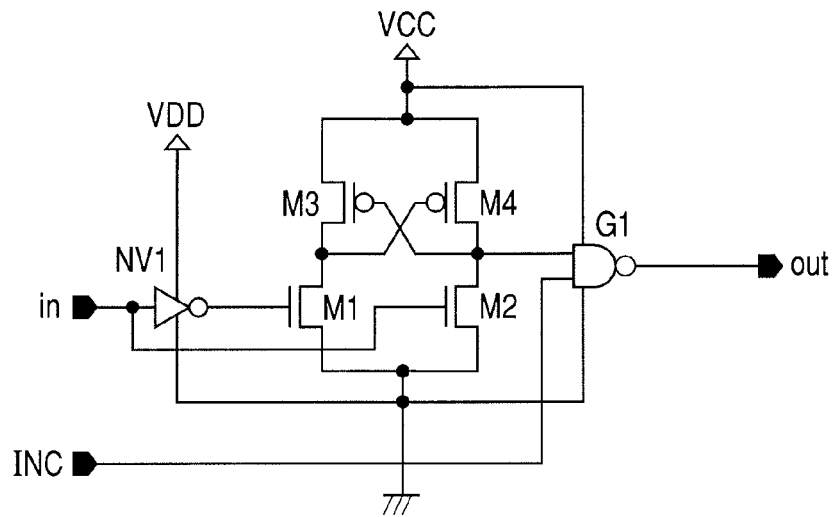
FIG. 4 is a circuit diagram of an example of input circuit provided in the micro input/output circuit of FIG. 3.

FIG. 4 is a circuit diagram of an example of input circuit provided in the micro input/output circuit of FIG. 3. This input circuit, receiving a VDD level input signal supplied from an input terminal in and supplies from an output terminal output a VCC level output signal having undergone level conversion. The input terminal in is connected to the input terminal of an inverter circuit NV1 operating on the low source voltage VDD. This input terminal in is connected to the gate of an N-channel MOSFET M2 which performs level conversion, and the output terminal of the inverter circuit NV1 is connected to the gate of an N-channel MOSFET M1 which performs level conversion. The ground potential of the circuit is given to the sources of these MOSFETs M1 and M2, and between their drains and the high source voltage VCC are disposed P-channel MOSFETs M3 and M4 whose gates and drains are cross-connected. The level-converted output signal from the commonly connected drains of the MOSFETs M2 and M4 is supplied to one of the input terminals of the NAND gate circuit G1. The other input terminal of this NAND gate circuit G1 is supplied with the control signal INC for preventing propagation of unfixed levels.

In this embodiment, when the control signal INC is set to the high level (logic 1), the gate circuit G1 inverts the signal converted in level from the VDD level to the VCC level and delivers the inverted signal. On the contrary, when the control signal INC is set to the low level (logic 0), the output signal of the gate circuit G1 is fixed to the high level (logic 1) irrespective of the level-converted signal. In other words, the power supply to the VDD-supplied logical operation circuit which supplies the source voltage VDD to the inverter circuit NV1 and the input signal to the input terminal in is cut off, with the result that, even if the level-converted signal takes on an unfixed level, such as a high output impedance, the output signal of the gate circuit G1 can be fixed to the high level (logic 1), unaffected by the unfixed level, by setting the control signal INC to the low level (logic 0). As a result, in the VCC-supplied logical circuit, inputting of any unfixed level can be prevented from inviting a through current or erroneous operation.

Figure 5:
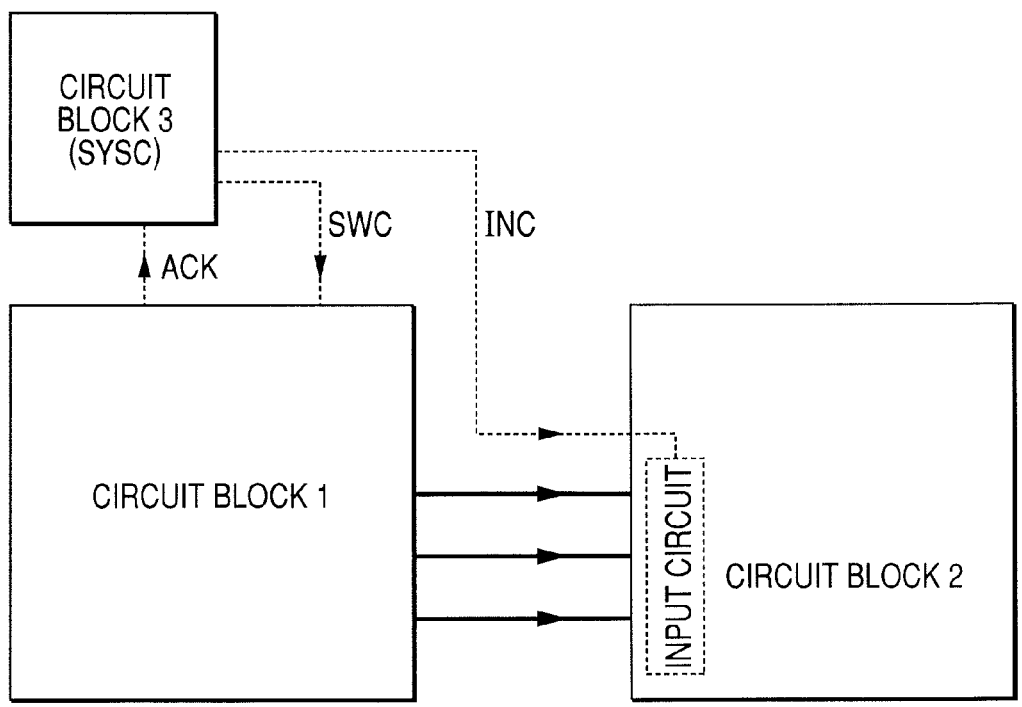
FIG. 5 shows the configurations of the smallest units of another semiconductor integrated circuit device pertaining to the invention.

FIG. 5 shows the configurations of the smallest units of another semiconductor integrated circuit device pertaining to the invention. This embodiment of the invention is a variation of what is shown in FIG. 1, and its configuration differs from that of the embodiment of FIG. 1 in that a response signal ACK matching the power supply control signal SWC is delivered from the circuit block 1 to the circuit block 3. Receiving this response signal ACK, the circuit block 3 generates the power supply control signal SWC and the control signal INC for preventing propagation of unfixed levels matching that signal SWC. In this drawing, these signal routes are distinguished from the routes of ordinary operational signals by being indicated in dotted lines.

Figure 6:
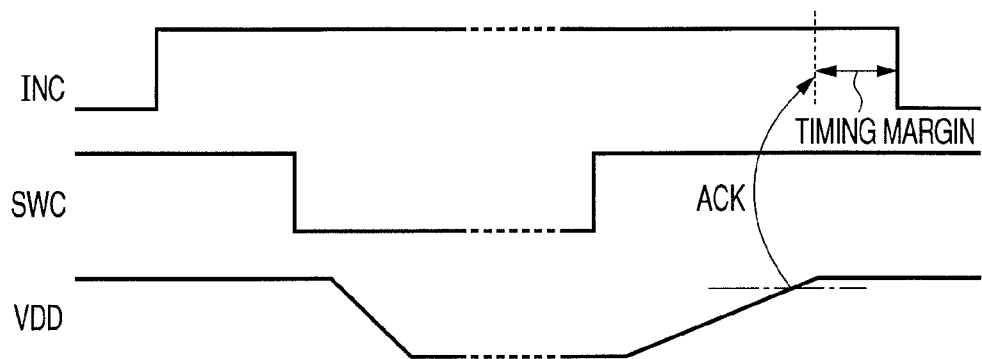
FIG. 6 is a waveform chart illustrating an example of operation of the circuit embodying the invention, shown in FIG. 5, FIGS. 7(A) and 7(B) are block diagrams illustrating an example of operating form of an input circuit for preventing the propagation of unfixed levels according to the invention.

FIG. 6 is a waveform chart illustrating an example of operation of the circuit embodying the invention, shown in FIG. 5. As in the configuration shown in FIG. 2, the circuit block 3 is caused to generate the control signal INC for preventing propagation of unfixed levels; the input circuit provided in the circuit block 2 stops capturing any unfixed level or any other input signal; after forming a fixed level matching the control signal INC, the power supply control signal SWC is set to the low level to turn off the power switch of the circuit block 1; the source voltage VDD for instance drops, and power supply is cut off. Therefore, as in the foregoing case, even if the output signal of the circuit block 1 becomes unfixed in level as a result of the power cut-off, the circuit block 2 is maintained at the fixed level.

Then, the power supply control signal SWC is raised to the high level by the circuit block 3 to turn on the power switch of the circuit block 1 to cause the source voltage VDD, for instance, to rise. The circuit block 1 here is provided with a voltage detecting circuit, which detects the rise of the source voltage VDD and, when the voltage reaches a level required for the operation of the circuit block 1, generates the response signal ACK. After having a power supply control circuit unit or the like generate a timing margin upon receipt of this response signal ACK, the circuit block 3 judges that the output level of the circuit block 1 is not an unfixed level, and control is so effected as to enable the signal formed by the circuit block 1 to be received by the circuit block 2 by setting the control signal INC for preventing propagation of unfixed levels to the low level.

FIG. 7 and FIG. 8 are block diagrams illustrating operating forms of an input circuit for preventing the propagation of unfixed levels according to the invention. FIG. 7 and FIG. 8 show cases wherein there is a switchover from the upper state in which power supply is on to both the circuit blocks 1 and 2 to the lower state in which power supply to only the circuit block 1 is off.

Figure 7A:
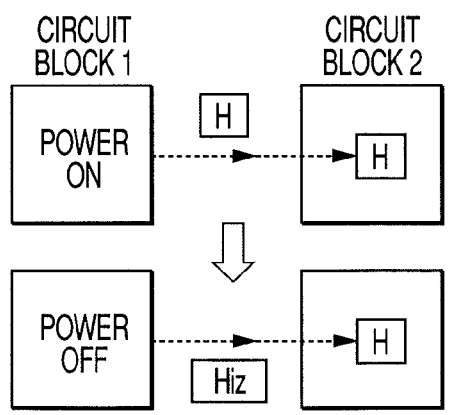

FIG. 7(A) shows a case in which a latch circuit is used as the input circuit. This is a state in which, when power supply to both the circuit blocks 1 and 2 is on, a signal of the high level (H) is delivered from the circuit block 1 to the circuit block 2. And when power supply to only the circuit block 1 is to be turned off as indicated by an arrow, the latch circuit fixes the high level (H) with the control signal INC for preventing propagation of unfixed levels generated before that, and outputs that signal fixed to the high level.

Figure 7B:
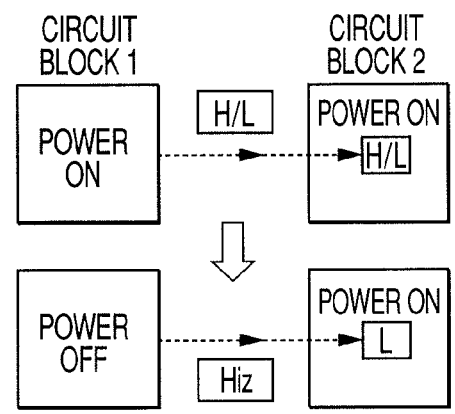

FIG. 7(B) shows a case in which a logical sum type circuit is used as the input circuit. This is a state in which, when power supply to both the circuit blocks 1 and 2 is on, a high level/low level (H/L) is delivered from the circuit block 1 to the circuit block 2. And when power supply to only the circuit block 1 is to be turned off as indicated by an arrow, a logical sum type circuit, such as a NOR circuit, fixes the low level (L) with the high level (logic 1) of the control signal INC for preventing propagation of unfixed levels generated before that, and outputs that signal fixed to the low level. Where an OR circuit, another logical sum type circuit, is used as the input circuit, the high level (H) of the signal is fixed with the high level (logic 1) of the control signal INC, and outputs that signal fixed to the high level.

Figure 8A:
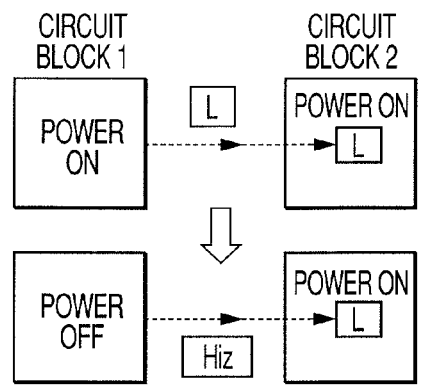
FIGS. 8(A) and 8(B) are block diagrams illustrating another example of operating form of an input circuit for preventing the propagation of unfixed levels according to the invention.

FIG. 8(A) shows another case wherein a latch circuit is used as the input circuit. This is a state in which, when power supply to both the circuit blocks 1 and 2 is on, a signal of the high level (L) is delivered from the circuit block 1 to the circuit block 2. And when power supply to only the circuit block 1 is to be turned off as indicated by an arrow, the latch circuit fixes the high level (L) with the control signal INC for preventing propagation of unfixed levels generated before that, and outputs that signal fixed to the high level.

Figure 8B:
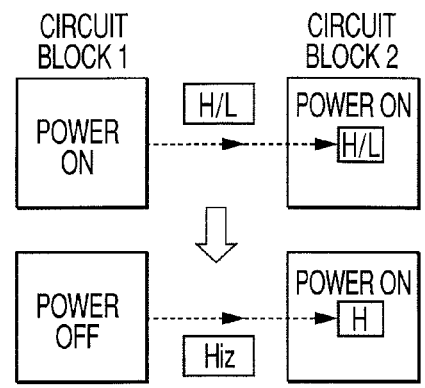

FIG. 8(B) shows a case in which a logical product type circuit is used as the input circuit. This is a state in which, when power supply to both the circuit blocks 1 and 2 is on, a high level/low level (H/L) is delivered from the circuit block 1 to the circuit block 2. And when power supply to only the circuit block 1 is to be turned off as indicated by an arrow, a logical product type circuit, such as a NAND circuit, fixes the high level (H) with the low level (logic 0) of the control signal INC for preventing propagation of unfixed levels generated before that, and outputs that signal fixed to the high level. Where an AND circuit, another logical product type circuit, is used as the input circuit, the low level (L) of the signal is fixed with the low level (logic 0) of the control signal INC, and outputs that signal fixed to the low level.

Figure 9:
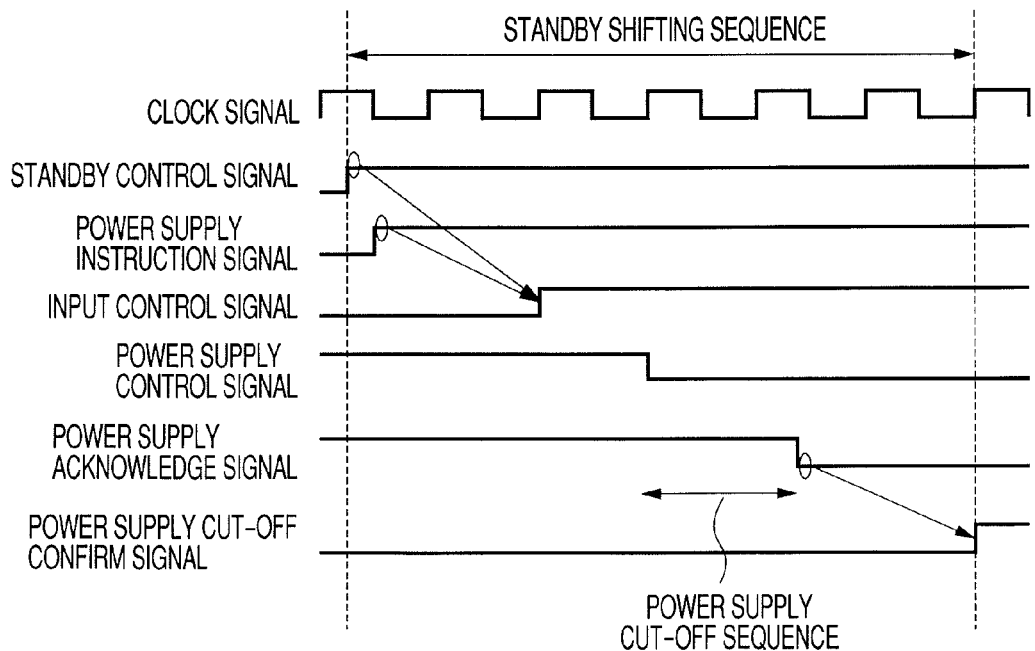
FIG. 9 is a timing chart illustrating an example of standby shifting sequence of a specific circuit block in a semiconductor integrated circuit device embodying the invention.

FIG. 9 is a timing chart illustrating an example of standby shifting sequence of a specific circuit block in a semiconductor integrated circuit device embodying the invention. In a device managing the whole system mounted with this semiconductor integrated circuit device pertaining to the invention, for instance a central processing unit (CPU) or the like for executing signal processing of the system in accordance with a program, when the execution of the program generates a standby control signal to instruct a specific circuit block to shift to a standby state, a power supply instruction signal is entered into this semiconductor integrated circuit device pertaining to the invention the power supply control circuit SYSC shown in the circuit block 3 raises the input control signal to the high level, and a fixed level matching the input control signal is formed for the input circuit, which is disposed in the circuit block to which power supply is to be turned on and receives a signal from the circuit block to which power supply is to be turned off.

After an operation to forbid propagation of signals of unfixed level is executed by the high level of such an input control signal, an instruction to cut off power supply by setting the power supply control signal to the low level is given from the power supply control circuit SYSC to the circuit block to which power supply is to be turned off. In the circuit block to which power supply cut-off has been instructed, a power supply cut-off sequence in which the power switch is turned off to match the low level of the power supply control signal is executed. For this reason, the circuit block to which power supply is to be turned off is provided with a circuit which, as will be described afterwards, is supplied with power all the time and performs control turn on and off power supply. This power supply cut-off sequence is communicated to the power supply control circuit SYSC by the low level of the power supply acknowledge signal. And in the power supply control circuit SYSC, a power supply cut-off confirm signal is communicated to, among others, the CPU having issue the standby control signal.

Figure 10:
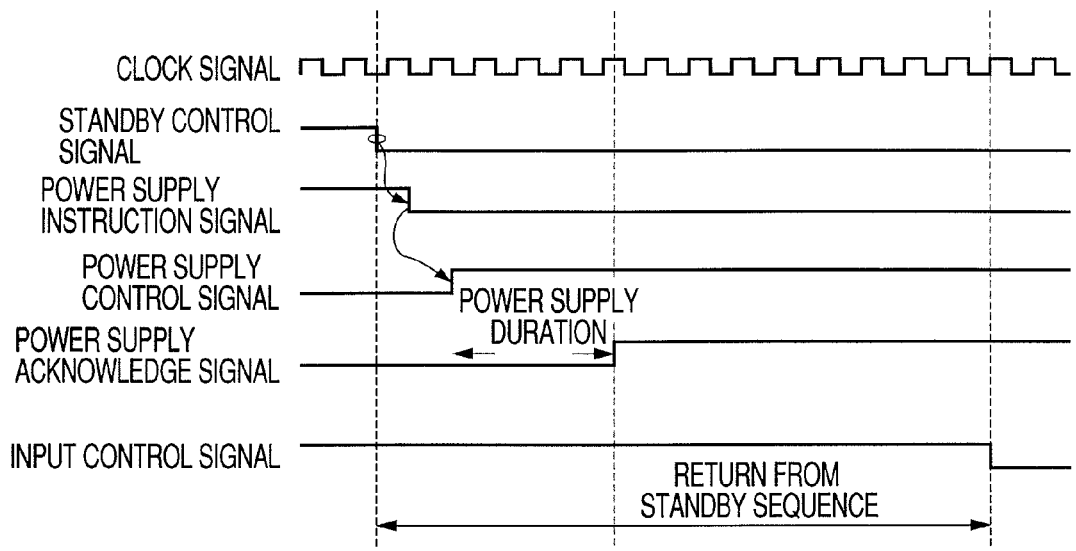
FIG. 10 is a timing chart illustrating an example of return from standby sequence of the specific circuit block in the semiconductor integrated circuit device pertaining to the invention.

FIG. 10 is a timing chart illustrating an example of return from standby sequence of the specific circuit block in the semiconductor integrated circuit device pertaining to the invention. As in the foregoing case, when standby control signal to instruct the specific circuit block to return from a standby state is generated by the execution of the program by the central processing unit (CPU) or the like managing the whole system, a power supply instruction signal is inputted to this semiconductor integrated circuit device pertaining to the invention, an instruction to turn on power supply is given by delivering a power supply control signal set to the high level from the power supply control circuit SYSC shown as the circuit block 3 to the circuit block to which power supply is to be turned on. In the circuit block to which power supply has been instructed, a power supply duration by which the power switch is to be turned on to match the high level of the power supply control signal is executed by the circuit described above. And, after waiting for a certain period which power turning-on is completed, the input control signal is reduced to the low level, and the input circuit performs an operation capture into the circuit block 2 a signal from the circuit block to which power supply has been turned on. Then, though not shown, the power supply acknowledge signal is also delivered to the power supply control circuit SYSC to inform the CPU or the like, which has issued the standby control signal, of the control of the generation of the input control signal and a power supply turn-on confirm signal.

Figure 11:
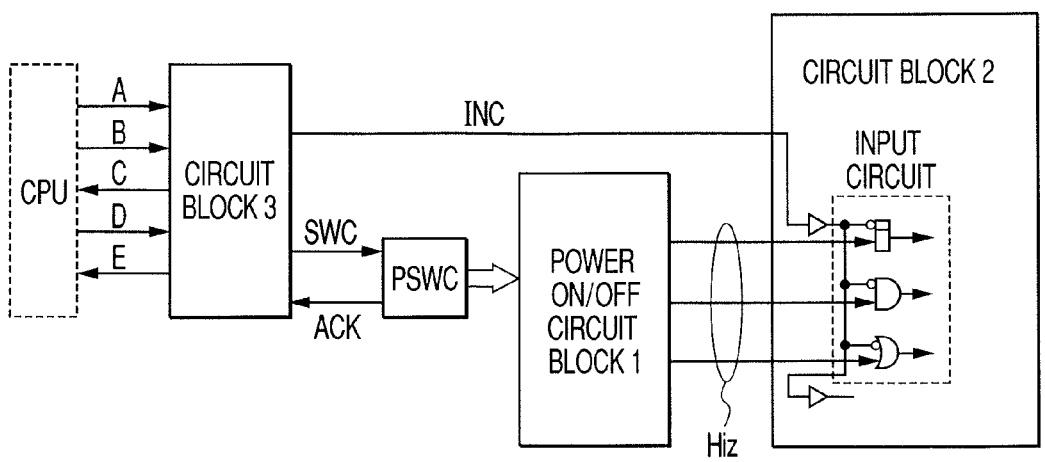
FIG. 11 is a schematic block diagram of a whole system pertaining to the invention corresponding to FIG. 10 and FIG. 11.

FIG. 11 is a schematic block diagram of a whole system pertaining to the invention corresponding to FIG. 9 and FIG. 10. An instruction to place a specific circuit block in a standby state is given to the circuit block 3 with signals A and B from a device managing the standby mode, typically a CPU. The module to manage the standby mode is not limited to the CPU, but may be any appropriate module. The signals A and B correspond to, for instance the standby control signal and the power supply instruction signal shown in FIG. 9 and FIG. 10 above. The circuit block 3 forms the power supply control signal SWC correspondingly to such signals A and B, and delivers them to a power switch controller PSWC. The power switch controller PSWC, as will be described afterwards, is a circuit appended to the circuit block 1 placed in the standby state, and returns to the circuit block 3 a control signal for performing on/off control of the power switch provided for the circuit block 1 and the response signal ACK matching the power supply control signal SWC. Whereas power switch controller PSWC is contained in the circuit block 1 in FIG. 1, FIG. 5 and other drawings above, since a voltage is constantly supplied to it, it is shown as a separate circuit block from the circuit block 1 in FIG. 11 to make clear this constant voltage supply.

Signals formed in the circuit block 1 are communicated to the circuit block 2. The circuit block 2 is provided with the input circuit for receiving signals delivered from the circuit block 1, and is controlled with the control signal INC for preventing propagation of unfixed levels generated in relation to the power supply control signal SWC. Thus, before power supply to the circuit block 1 is cut off with the power supply control signal SWC, the level of the signal to be delivered to the circuit block 2 is fixed as stated above with such control signal INC to prevent in advance the unfixed level (Hiz) accompanying the power supply cut-off from being communicated. Between the circuit block 3 and the CPU and the like, signals C, D, E and so forth are exchanged. These signals C, D and E are signals required by the CPU or the like executing the program for reliably controlling the operation of the whole system, such as a power supply cut-off confirm signal, a return from standby signal or a standby release signal.

Figure 12:
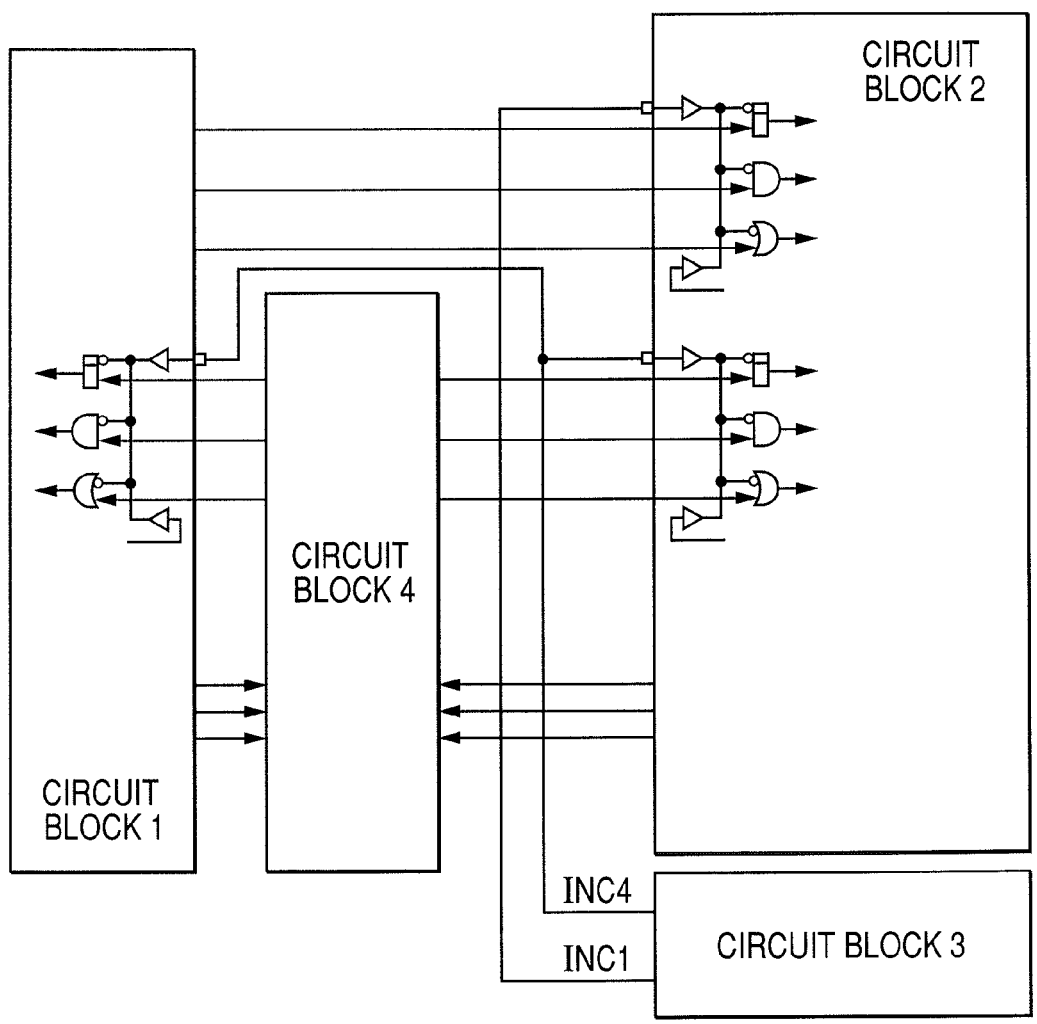
FIG. 12 is a schematic block diagram of a semiconductor integrated circuit device pertaining to the invention.

FIG. 12 is a schematic block diagram of one example of semiconductor integrated circuit device pertaining to the invention. This is a variation of the embodiment shown in FIG. 1 above, with a circuit block 4 being added. Although this circuit block 4 delivers signals to the circuit block 1 and the circuit block 2, neither of the two circuit blocks 1 and 2 delivers signals to it. To the circuit block 1, signals are delivered only from the circuit block 4. To the circuit block 2, signals are delivered from both the circuit blocks 1 and 4. An input circuit or circuits are provided to match signals delivered in this way to each block. Thus, the circuit block 1 is provided with one input circuit to match signals from the circuit block 4, and the circuit block 2 is provided with two input circuits to match signals from the circuit blocks 1 and 4.

Therefore, the circuit block 3 generates two kinds of signals for preventing propagation of unfixed levels, the control signals INC1 and INC4, to match power supply cut-off to the circuit blocks 1 and 4. Thus, when power supply to the circuit block 4 is to be turned off, correspondingly the control signal INC4 is generated to control the input circuits of the circuit blocks 1 and 2 to prevent any unfixed level from the circuit block 4. When power supply to the circuit block 1 is to be turned off, correspondingly the control signal INC1 is generated to control the input circuit of the circuit block 2 to prevent any unfixed level from the circuit block 1. As the circuit block 2 delivers signal to neither of the circuit blocks 1 nor 4, there is no need to generate a matching control signal INC for preventing propagation of unfixed levels. Further, even the circuit block 4, which does receive signals from other circuit blocks 1 and 2 as illustrated in the drawing, requires no input circuit for preventing propagation of unfixed levels on condition that power supply to it is off whenever that to other circuit blocks 1 and 2 is off.

Figure 13:
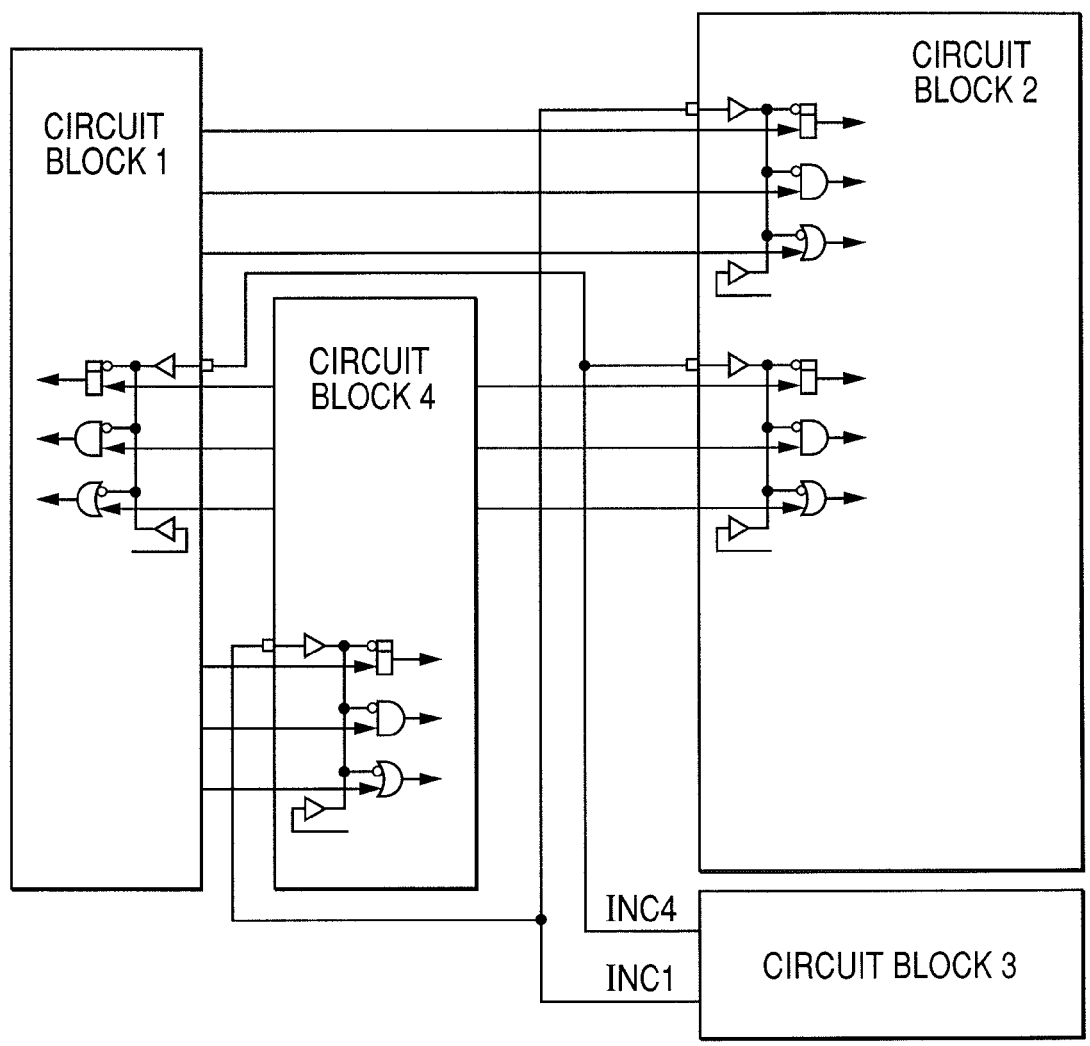
FIG. 13 is a schematic block diagram of another semiconductor integrated circuit device pertaining to the invention.

FIG. 13 is a schematic block diagram of another semiconductor integrated circuit device pertaining to the invention. This is a variation of the embodiment shown in FIG. 12 above, in which signals are delivered to the additional circuit block 4 from the circuit block 1. Matching such signals delivered from the circuit block 1, an input circuit is disposed in the circuit block 4. In this embodiment, the relationship between the circuit blocks 1 and 4 is different from that in FIG. 12 above, and power supply to the circuit block 1 is allowed to be turned off when that to the circuit block 4 is on. Therefore in the circuit block 3, in the same way as described above, when power supply to the circuit block 1 is to be turned off, correspondingly the control signal INC1 is generated to control the input circuits of the circuit blocks 2 and 4 to prevent any such unfixed level from the circuit block 1.

Figure 14:
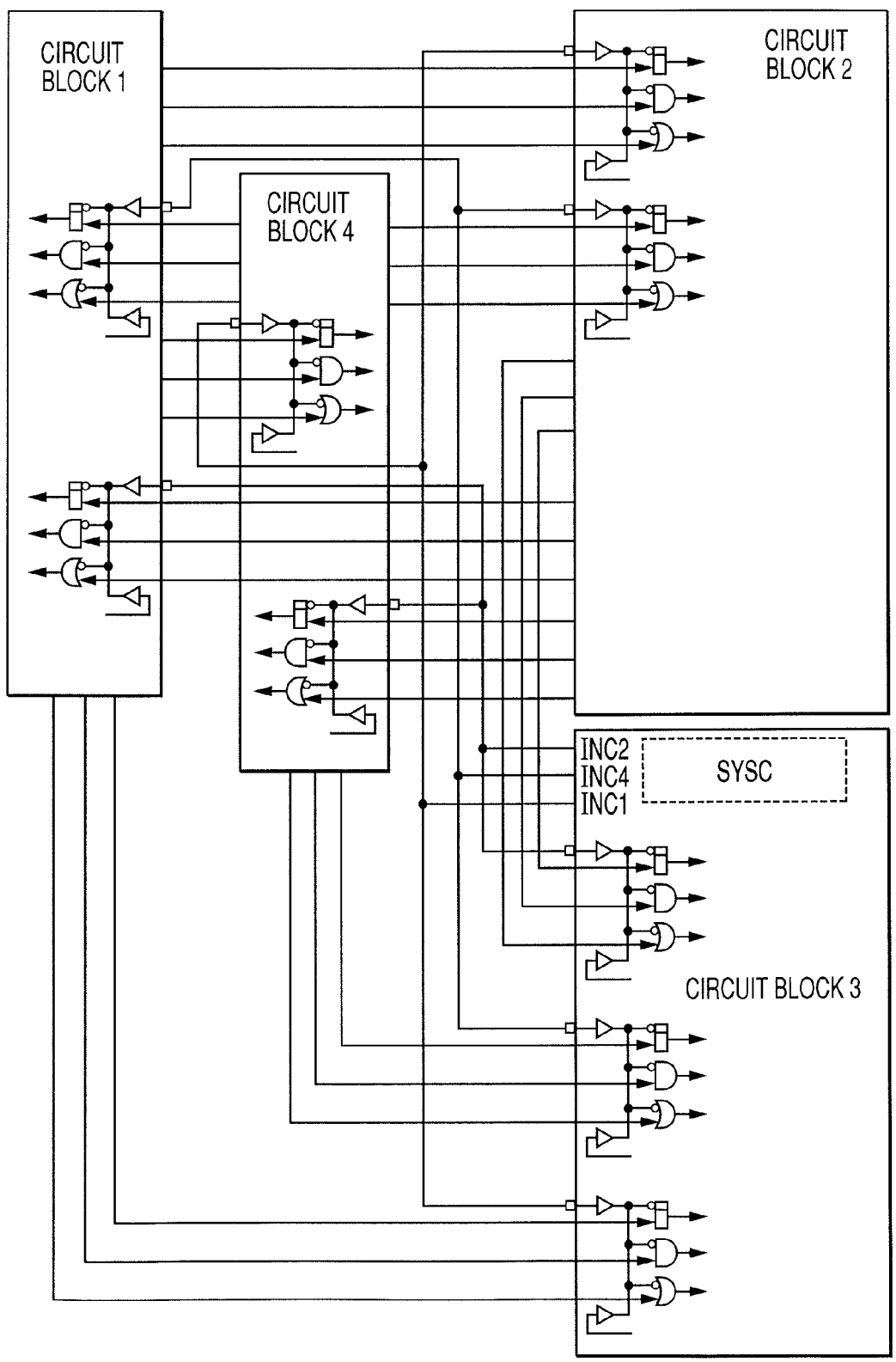
FIG. 14 is a schematic block diagram of still another semiconductor integrated circuit device pertaining to the invention.

FIG. 14 is a schematic block diagram of still another semiconductor integrated circuit device pertaining to the invention. This is a variation of the embodiment shown in FIG. 12 above, in which signals are delivered to the additional circuit block 4 from not only the circuit block 1 but also the circuit block 2. Also, the circuit block 2 delivers signals to the circuit block 1. Furthermore, the circuit block 3 is provided with a logical circuit which in its operation receives signals from the circuit blocks 1, 2 and 4 in addition to the aforementioned power supply control circuit SYSC. Viewed the other way around, if there is a specific circuit block 3 which can keep the power supply control circuit SYSC supplied with power all the time, it will be incorporated there. Such a circuit block 3 is provided with three input circuits to match signals from the circuit blocks 1, 2 and 4.

Therefore, the power supply control circuit SYSC of the circuit block 3 generates three kinds of signals for preventing propagation of unfixed levels, the control signals INC1, INC2 and INC4, to match power supply cut-off to the circuit blocks 1, 2 and 4. When power supply to the circuit block 1 is to be turned off, correspondingly the control signal INC1 is generated to control the input circuits of the circuit blocks 2, 3 and 4 to prevent any such unfixed level from the circuit block 1. When power supply to the circuit block 2 is to be turned off, correspondingly the control signal INC2 is generated to control the input circuits of the circuit blocks 1, 3 and 4 to prevent any such unfixed level from the circuit block 2. And when the circuit block 4 is to be turned off, correspondingly the control signal INC4 is generated to control the input circuits of the circuit block 1, 2 and 3 to prevent any such unfixed level from the circuit block 4. In this manner, power supply to any of the circuit blocks 1, 2 and 4, but not the circuit block 3, can be turned off as desired, and correspondingly the control signals INC1, INC2 and/or INC4 are generated in advance.

Figure 15:
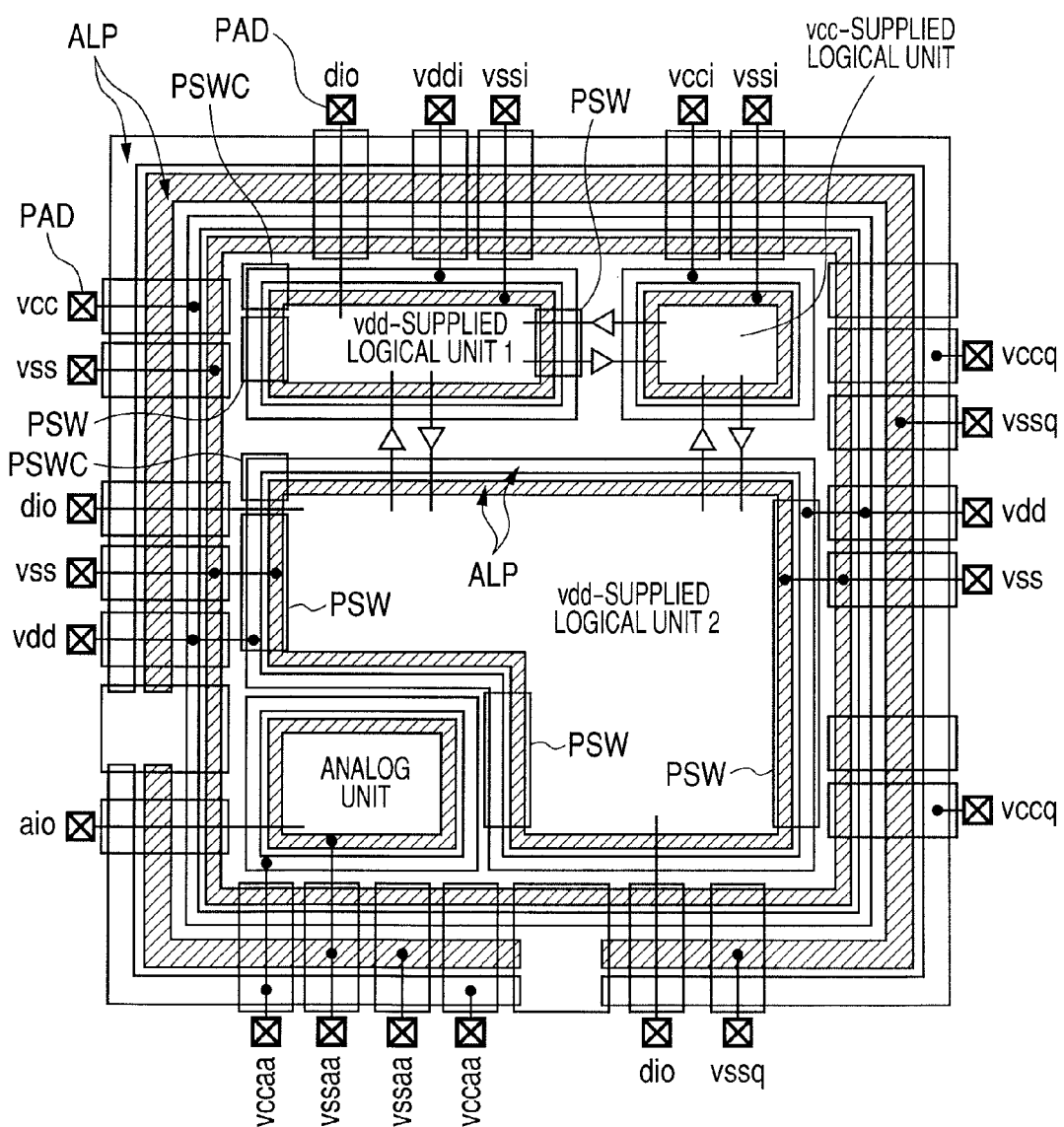
FIG. 15 is a schematic layout of a semiconductor integrated circuit device pertaining to the invention.

FIG. 15 is a schematic layout of another example of semiconductor integrated circuit device pertaining to the invention. The layout in this drawing centers on power supply lines formed in the semiconductor integrated circuit device pertaining to the invention. The power supply lines comprise a pair of a source voltage line and the ground wire of the circuit, and the latter is hatched to make the wiring layout more easily perceivable.

The semiconductor integrated circuit device of this embodiment is designed to operate on two kinds of source voltages, vcc and vdd. The source voltages vcc are relatively high, such as 3.3 V, and the source voltages vdd are relatively low, such as 1.2 V, though these are not absolutely required. The relatively high source voltages vcc have a source voltage vccaa for analog and logical units, a source voltage vccq for input/output circuits and a source voltage vcci for internal circuits. Respectively matching these source voltages vccaa, vccq and vcci, there are provided circuit ground potentials vssaa, vssq and vssi. The power supply lines expressed in bold wiring lines along the outer circumference of the semiconductor chip are bisected into one for analog circuits and the other for digital circuits; the source voltages vccaa and vccq are arranged outside, and inside the respective ones of them are arranged circuit ground vssas and vssq. As vcc-supplied internal circuits each having a specific circuit function, there are a vcc-supplied logical unit and an analog logical unit, and power supply lines represented by fine wiring lines surround each. The power supply lines surrounding the vcc-supplied logical unit are connected to power supply pads vcci and vssi. The power supply lines surrounding the analog logical unit, together with the bold power supply lines, are connected to power supply pads (PAD) vccaa and vssaa.

There are disposed two kinds of power supply lines vdd and vss, including what are represented by thin ring-shaped ones along the inside of the power supply line represented by bold wiring lines and what match the internal circuits to be described afterwards. The vdd-power supply lines arranged in a ring shape are used for supplying the operating voltage of a level converting circuit for converting vdd-internal signals into large amplitude signals, such as the vcc signals in an input/output interface and operating voltages including those for the vdd-supplied internal circuits operating all the time, such as micro exchanging signals among a vdd-supplied logical unit 1, a vdd-supplied logical unit 2 and a vcc-supplied logical unit. The vdd-supplied internal circuits include the vdd-supplied logical unit 1 and the vdd-supplied logical unit 2. Surrounding these circuit blocks, power supply lines represented by thin wiring lines are disposed. The vdd-supplied logical unit 2 is provided with independent power supply pads (PAD), such as vddi and vssi, for the purpose of noise separation between the vdd-supplied logical unit 1 and the internal circuits operating on the ring-shaped power supply lines.

Matching the power supply lines, power supply pads (PAD) vcc and vss, vdd and vss, vccq and vssq, vccaa and vssaa are disposed, each in a plurality of sets as required. Among other pads (PAD) illustrated as representative ones, a io are intended for inputting/outputting analog signals, and vdd-dio are intended for direct digital inputting/outputting between the vdd-supplied logical unit 1 and the vdd-supplied logical unit 2. Illustration of vcc-supplied pads for signal inputting/outputting is dispensed with in this drawing. The rectangular blocks shown correspondingly to the pads constitute input/output interface circuits. Signal input/output pads matching the input/output interfaces are represented by such typical examples as the pads dio and aio. In particular, input/output pads for digital signals are disposed in a large number, along with power supply pads, surrounding the outer circumference of the semiconductor chip.

In this embodiment, the internal circuit blocks of the vdd-supplied logical unit 1 and the vdd-supplied logical unit 2 are provided with a function to enter a power saving mode when no operation is done even though power supply is on. In order to realize this power saving mode, power switches PSW are disposed underneath the power supply lines formed to surround the internal circuits, and power switch control circuits PSWC are arranged underneath the corners of the power supply lines. Furthermore, power supply main lines (vcc and vss, vdd and vss, vccq and vssq, vccaa and vssaa) formed to surround the respectively matching circuits in order to reduce the impedances of the power supply lines to be described afterwards among other purposes are formed of relatively thick aluminum pad wires ALP, formed in the same process as the bonding pads.

Figure 16:
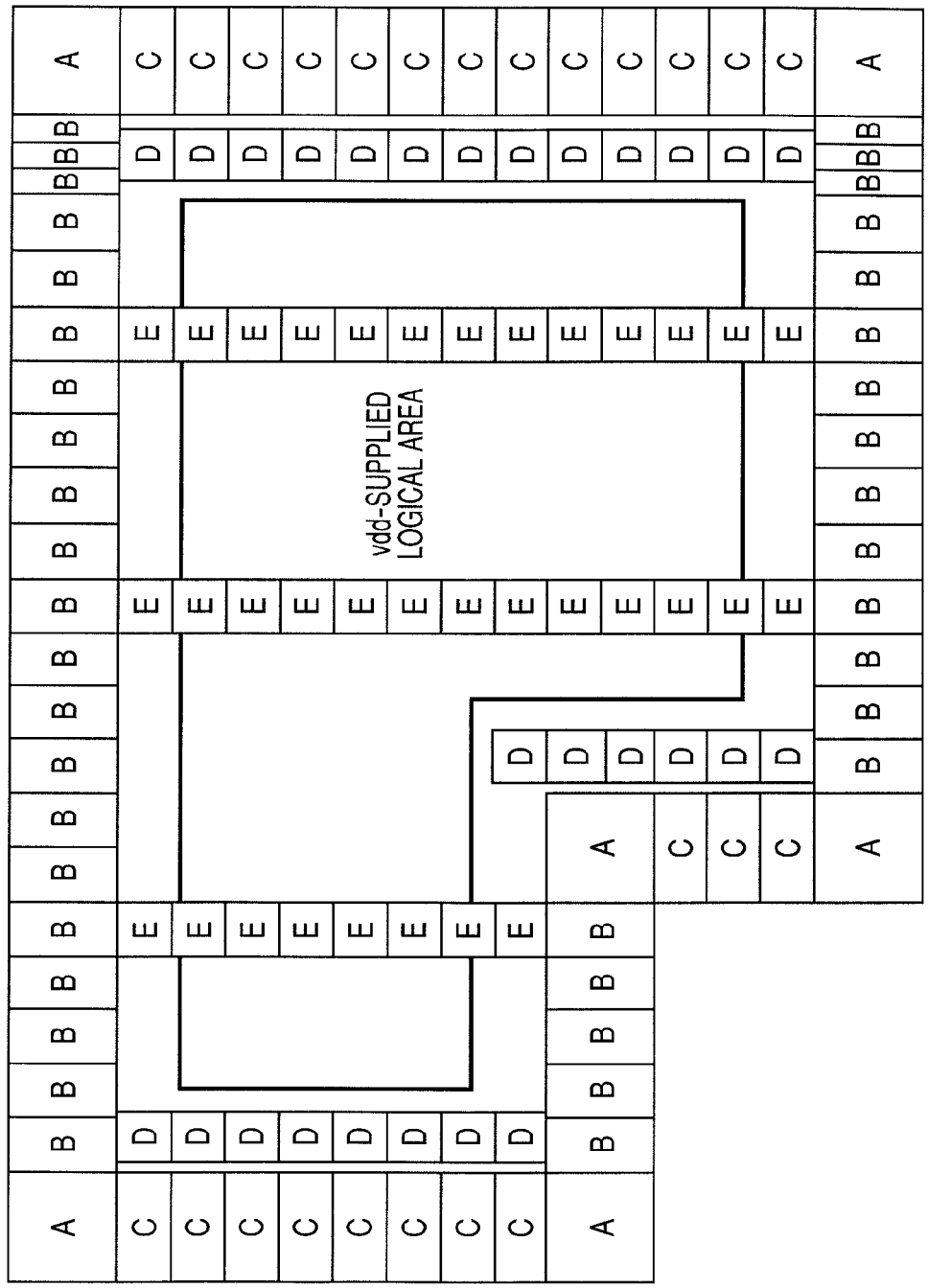
FIG. 16 is a layout of one example of power supply lines matching the vdd-supplied logical unit 2 in FIG. 15.

FIG. 16 is a layout of one example of power supply lines matching the vdd-supplied logical unit 2 in FIG. 15. In this embodiment, the power supply lines are configured in a cell form. The variety of cells, though not limited, can be prepared in four types, A through D, broadly classified. In the directions of letters A through D, the cells C constitute power supply lines extending in the longitudinal direction. The cells B constitute power supply lines extending in the lateral direction. The cells A constitute corners formed by the longitudinal and lateral power supply lines. The cells B include standard cells and mini-cells B for length adjustment, though this differentiation is not absolutely necessary.

The cells E constitute power supply lines extending in the longitudinal direction above the part where the vdd-supplied logical unit 2 is formed, and connect the opposite cells B. These cells E are used for configuring a power supply mesh to be described afterwards. The cells D, which are internal linking cells, extend in the lateral direction from the power supply lines extending in the longitudinal direction, and are used for linking with the internal power supply lines of the internal circuits. Circuit elements constituting the power switch elements and power switch control circuits are arranged underneath the cells A, B and C out of these cells A through E. Unlike them, the cells E are only for power supply lines. The cells D are provided with under-layer wiring for linking with internal power supply lines.

Figure 17:
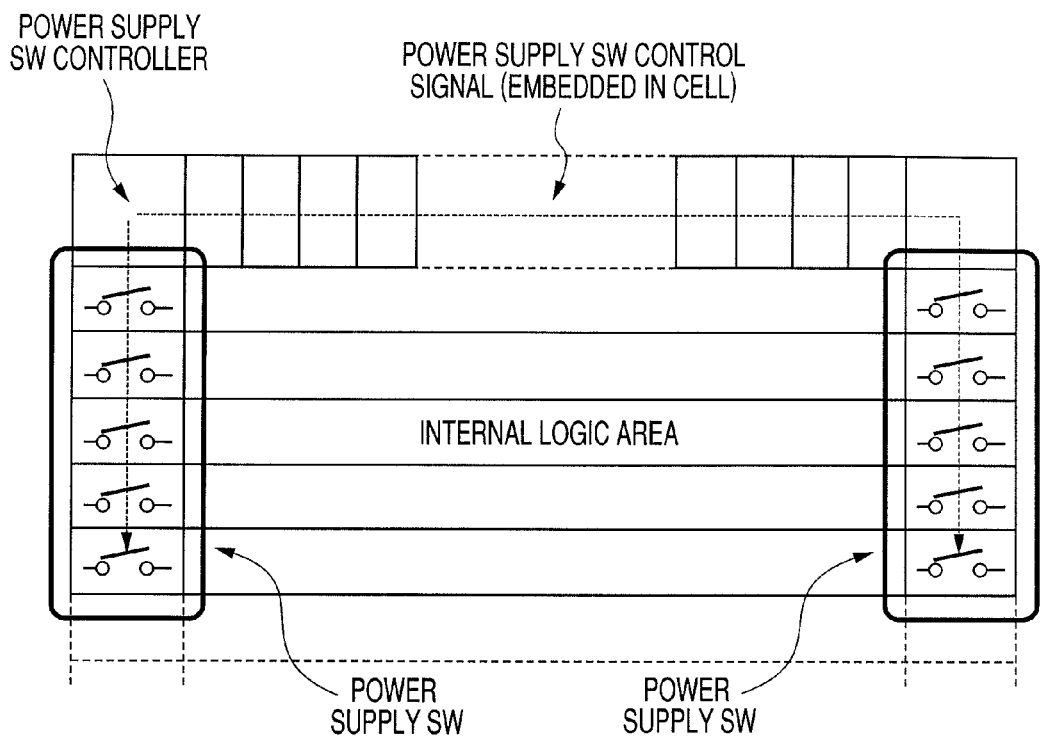
FIG. 17 is a schematic layout of one example of lower part of the power supply line matching the vdd-supplied logical unit 1 in FIG. 15.

FIG. 17 is a schematic layout of one example of lower part of the power supply line matching the vdd-supplied logical unit 1 in FIG. 15. In this embodiment, the relationship between the cells C and the cells A is mainly illustrated. The cells C are provided with switches. Each of these switches is connected at one end to the ground wire vssi of the circuit out of the source voltage lines vddi and vssi disposed above and at the other end to a ground wire for supplying the ground potential of the circuit to the internal logic area, though these connections are not the only possible ones. In the internal logic area, there is a laterally wide well area in which P-channel MOSFETs and N-channel MOSFETs constituting CMOS logical circuits like gate arrays are formed, though this is not the only possible arrangement, and switches are disposed correspondingly along this well area. Along the P-type well in which the N-channel MOSFETs are formed, the ground wires vss of the internal circuits are arranged in the lateral direction. On the other hand, along the N-type well in which P-channel MOSFETs are formed, power supply lines vdd are arranged in the lateral direction. In this drawing, the blocks dividing the internal logic area longitudinally and laterally match the respective circuit areas in which the N-channel MOSFETs and the P-channel MOSFETs are formed.

In the cell A arranged at the top left corner, there is disposed a power supply SW controller (power switch control circuit PSWC) for the on/off control of the switches provided in the cells C. Switch control signals formed by this power supply SW controller are delivered to individual switches via the power supply SW control signal lines indicated by dotted lines in the drawing. In this drawing, the power supply SW control signal lines for controlling the power SWs (switches) disposed in the cells C arranged to the left of the internal logic area deliver signals to the switches in the cells C by utilizing wiring areas disposed in these cells C.

The power supply SW control signal lines for controlling the power supply SWs disposed in the cells C arranged to the right of the internal logic area deliver signals to the switches in the cells C arranged to the right by utilizing wiring areas disposed in the cells B and wiring areas disposed in the cells A. Since these switches are intended for controlling power supply to the internal circuits as stated above, no such switches are needed in the corners. Therefore, by arranging the power supply SW controller (power switch control circuit PSWC), the circuit formation area underneath the power supply lines is effectively utilized.

Out of the switches disposed in the cells C as described above, those for supplying the ground potential of the circuit are provided correspondingly to internal ground wires matching the laterally wide P-well area in which N-channel MOSFETs are formed. Therefore, in the unoccupied areas of the cells C matching the N-type well area in which P-channel MOSFETs are formed, capacitors can be disposed for use in stabilizing power supply. Similarly, capacitors can also be disposed in the cells B underneath the power supply lines.

Figure 18:
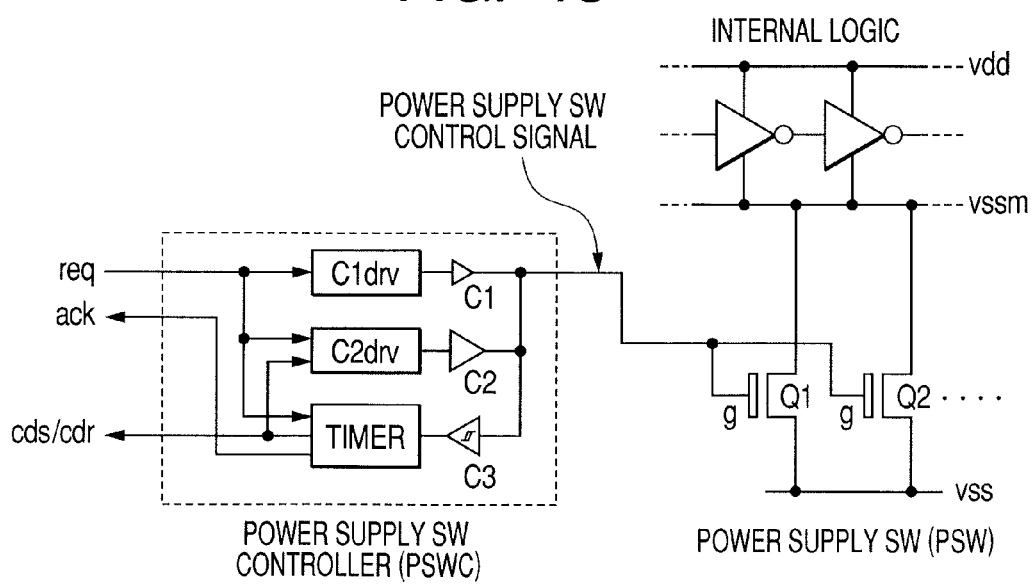
FIG. 18 is a circuit diagram illustrating the relationship among the power supply SW controller (PSWC), the power supply SW and the internal logic in FIG. 17.

FIG. 18 is a circuit diagram illustrating the relationship among the power supply SW controller (PSWC), the power supply SW and the internal logic in FIG. 17. An inverter circuit shown as representing the internal logic works on the operating voltage transmitted via the power supply line vdd and the internal ground wire vssm. On the power supply line vdd of the internal logic, the source voltage supplied from the aforementioned external terminal is constantly delivered via the pads and wiring routes. The internal ground wire vssm is connected to the ground wire vss formed to surround the internal circuits via the N-channel MOSFETs Q1 and Q2 as power supply SWs (switches) illustrated as being representative. The gates g of the MOSFETs as the plurality of switches provided to match the cells C are commonly supplied with the power supply SW control signal.

The power supply SW controller (PSWC) generates switch control signals for the MOSFETs Q1 and Q2 and the like in response to a control signal req. If the MOSFETs Q1 and Q2 are switched over from the off state to the on state at high speed in the internal logic, currents will flow simultaneously in the inverter circuit, logical gate circuits and the like in the internal logic on account of the input signal being unfixed and other reason, giving rise to large noise in the source voltage vdd the ground potential vss of the circuit or imposing the burden of large instantaneous current supply on the power supply unit of the system. In view of this problem, in this embodiment, power supply SW control signals to drive the MOSFETs Q1 and Q2 in two separate stages are generated by two driving circuits C1drv and C2drv, output circuits C1 and C2 thereby caused to generate output signals, a decision circuit C3 for determining the level of the power supply SW control signals and a timer circuit Timer.

When the control signal req instructs an action to turn on power supply, the driving circuit C1drv in response raises the gate voltages of the MOSFETs Q1 and Q2 as the power switches through the output circuit C1. The output circuit C1 is formed of a MOSFET whose current supply capacity is small, and the connection of the gates g of the MOSFETs Q1 and Q2 and so forth as a large number of power switches results in a gradual rise in the level of the power supply SW control signal line having a large load capacity. The MOSFETs Q1 and Q2 and so forth as power switches are thereby so controlled as to let flow relatively small currents when their gate voltage reaches or surpasses the threshold voltage. It is thereby made possible to prevent the aforementioned problem of giving rise to large noise in the source voltage vdd and the ground potential vss of the circuit or imposing the burden of large instantaneous current supply on the power supply unit on account of the input signal being unfixed in the inverter circuit or the logical gate circuits of the internal logic. To add, as the occurrence of noise is likely to adversely affect other logical circuits, interface circuits and analog circuits in operation, this is a problem that has to be taken into consideration where the system is to be equipped with a function to shift to a power saving mode by cutting off power supply to some circuit when no action is to be done on that circuit.

The timer circuit Timer actuates the output circuit C2 via the driving circuit C2drv when the voltage decision circuit C3 having hysteresis characteristics determines that the power supply SW control signal line has reached or surpassed a certain level. The output circuit C2 is formed of a MOSFET whose current supply capacity is large, and raises the level of the gates g of the MOSFETs Q1 and Q2 at high speed as a large number of power switches to the source voltage vdd. This places the vdd-internal logic in an operating state. The timer circuit Timer supplies with a delay in time a signal ack indicating the validity of the operation of the internal logic and informs other circuits of this validity. A signal cds/cdr, which is a signal for controlling the micro io, is used to limit the signal output conveyed to the micro io, for instance, until the signal of the internal logic is found valid. The signal ack can be used as the response signal ACK.

Figure 19:
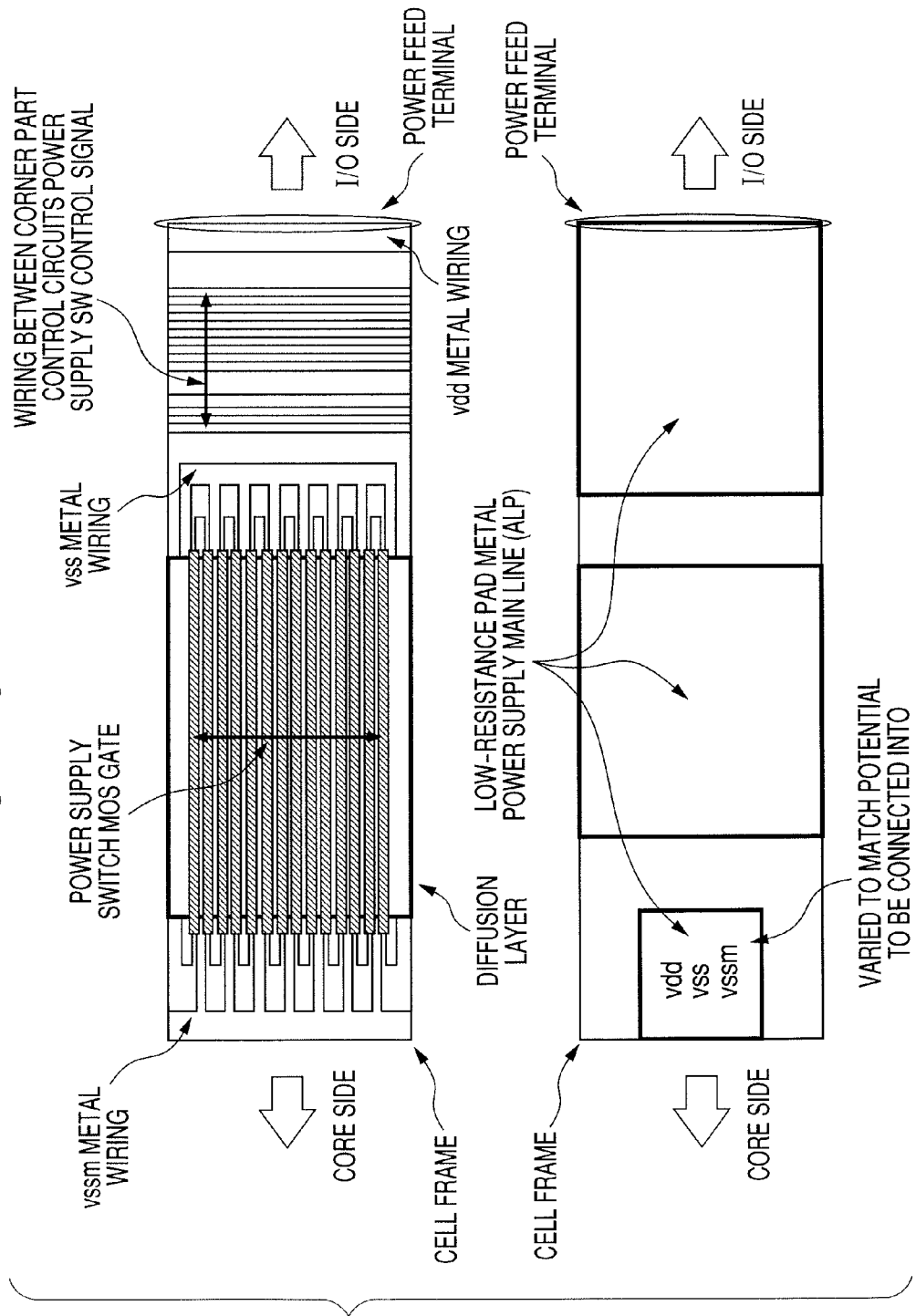
FIG. 19 is a schematic layout of one example of cell C in FIG. 16.

FIG. 19 is a schematic layout of one example of cell C. In FIG. 19, the power supply lines of the top layer and an element-formed part underneath them are shown one over the other. The lower part of the drawing shows the power supply lines of the top layer, wherein vdd and vss are paired. In this embodiment the power supply lines vdd and vss are formed of relatively thick aluminum layers (ALP), formed in the same process as the bonding pads. The core side is the side of the internal logic area, and the pad metal wiring on the core side can be varied to match the potentials to be connected into, such as vdd, vss and vssm.

The upper part of the drawing shows the element-formed part, wherein a plurality of gate electrodes extending in the lateral direction are disposed, arrayed in the longitudinal direction. Diffusion layers constituting sources and drains are formed, sandwiched between the gate electrodes. The diffusion layers sandwiched between the two gate electrodes constitute the common sources or drains of the MOSFETs having the two gate electrodes, and the sources and drains are alternately arranged with the gates between them. On the I/O side (right-hand side), every other diffusion layer is made a common source and connected to the power supply line vss. On the core side, every other one of the different diffusion layers from the above is made a common drain and connected to the vssm metal wiring, which is the ground wiring of the internal logic circuit. On the right hand side in the cell frame, a plurality of wiring layers extending in the longitudinal direction are provided to be used as wiring between the corner control circuits and as wiring for conveying power supply SW control signals.

Figure 20:
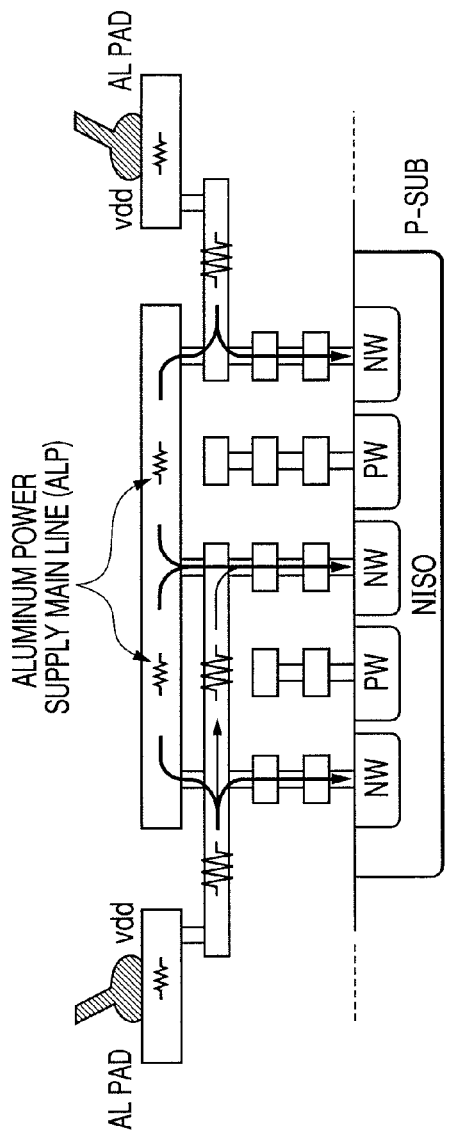
FIG. 20 is a schematic layout of one example of power supply line of the semiconductor integrated circuit device pertaining to the invention.

FIG. 20 shows a schematic structural section of one example of power supply line of the semiconductor integrated circuit device pertaining to the invention. In FIG. 20, a supply route of the source voltage vdd is illustrated as a representative of the routing. Thick bonding pads consisting of aluminum or the like are connected to a copper wiring layer. On one hand it is connected to a power supply main line ALP consisting of aluminum or the like and formed in the upper layer, and on the other hand it is connected via the wiring layer and contacts disposed in the lower layer to the N-type well area Nwin which P-channel MOSFETs are formed. This configuration places in a parallel relationship the power supply main line consisting of the lower wiring layer of copper and the upper wiring layer of aluminum. This causes the currents needed for the operation of the internal logic to flow divided between those two power supply routes, more of them flowing on the main line side to enable the impedance of the power supply line low. As a result, unevenness or variations of the source voltage in individual logical circuits while the internal logic is operating can be restrained. Since unevenness or variations of the source voltage greatly affects circuit operation when the internal logic is operating at a low voltage, such as the aforementioned 1.2 V (or even below), this embodiment can be expected to enable the internal logic circuits to operate stably. This also holds true of the ground wiring which provides the ground potentials of the circuits.

Figure 21:
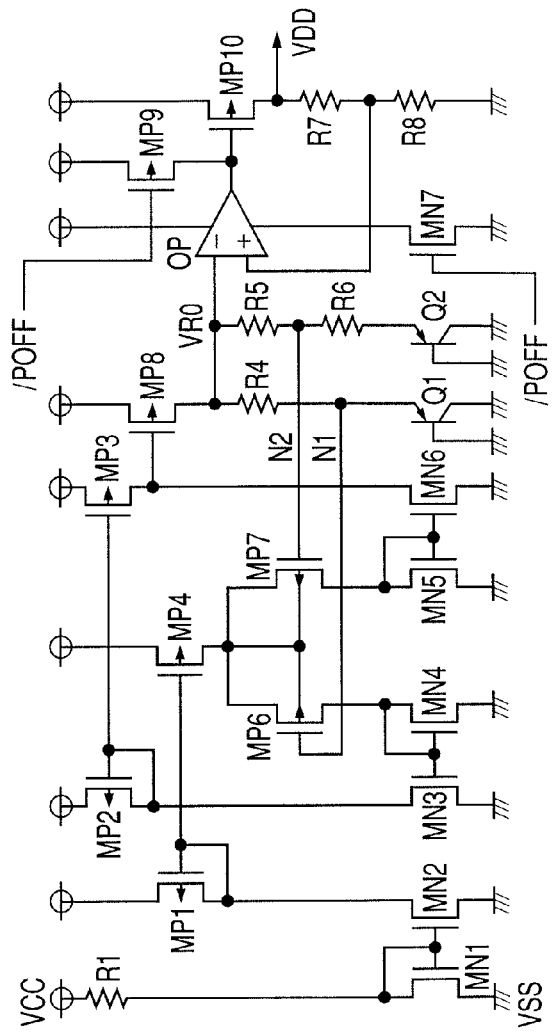
FIG. 21 is a circuit diagram of one example of step-down power supply circuit to be mounted on the semiconductor integrated circuit device pertaining to the invention.

FIG. 21 is a circuit diagram of one example of step-down power supply circuit to be mounted on the semiconductor integrated circuit device pertaining to the invention. In this embodiment, in the semiconductor integrated circuit device shown in FIG. 3 or FIG. 15 above, besides a low voltage VDD supplied from an external terminal, a high voltage VCC is supplied from outside and reduced to VDD by the step-down power supply circuit illustrated therein and delivered to internal circuits. Further, a power switch function is added to this voltage step-down circuit.

The collectors and bases of the transistors Q1 and Q2 and connected to the ground potential points of the circuit. The size (emitter area) of the transistor Q2 is made N times as large as that of the transistor Q1 and the current flowing to the emitter of the transistor Q1 is N times as dense as that flowing to the emitter of the transistor Q2 to keep constant the voltage difference between the base and the emitter matching the silicon band gap. One end of a resistor R6 is connected to the emitter of the transistor Q2, and control is so performed with a differential amplifier to equalize the potential of the node N1 of the emitter of the transistor Q1 and that of the node N2 at the other end of the resistor R6.

Thus the voltages of the nodes N1 and N2 are entered into the differential amplifier, its output voltage VRO is fed back to the nodes N1 and N2 via the resistors R4 and R5, a constant voltage matching the silicon band gap is supplied to the resistor R6, a constant current is let flow to the resistor R6, and control is so effected as to make the output voltage VRO a constant voltage (reference voltage) matching the silicon band gap by letting this constant current to the resistor R5. The resistors R5 and R4, by utilizing their positive temperature characteristics, compensate for the negative temperature characteristics of the base-emitter voltages of the transistors Q1 and Q2. The reference voltage VRO is about 1.1 V.

The differential amplifier is configured of the following circuit elements. P-channel type MOSFETs MP6 and MP7 are connected in a differential form. The gates of the differential MOSFETs MP6 and MP7 are connected to the nodes N1 and N2. A P-channel MOSFET MP4, constituting a current source, is disposed between the common source of the differential MOSFETs MP6 and MP7 and the source voltage VDD or the circuit. Diode-form N-channel MOSFETs MN4 and MN5 are disposed between the drains of the differential MOSFETs MP6 and MP7 and the ground potential of the circuit. The diode-form N-channel MOSFETs MP4 and MP5 are provided with N-channel MOSFETs MN3 and MN6 in the current mirror form. This causes a current matching the drain current of the MOSFET MP6 to be supplied from the drain of the MOSFET MN3.

The drain current of the MOSFET MN3 is supplied via a current mirror circuit consisting of P-channel type MOSFETs MP2 and MP3. The output current is supplied to the drain of the MOSFET MN6. As a result, a differential current between the drain currents of the differential MOSFETs MP6 and MP7 is caused to flow to the commonly connected drain of the MOSFETs MP3 and MN6. The common connection point of the MOSFETs MP3 and MN6 is connected to the gate of a P-channel MOSFET Q8. The drain of this MOSFET MP8 is connected to the resistors R4 and R5 to constitute the output voltage VRO.

A resistor R1 and a diode-form N-channel MOSFET MN1 are connected between the source voltage VDD and the ground potential of the circuit. An N-channel MOSFET MN2 is connected to this MOSFET MN1 in the current mirror form. A diode-form P-channel MOSFET MP1 is disposed between the drain and source voltage of this MOSFET MN2, and the connection of this MOSFET MP1 and the MOSFET MP4 in the current mirror form causes a current matching a current formed by the resistor R1 to serve as the bias current for the differential MOSFETs MP6 and MP7.

The transistors Q1 and Q2 are configured by using the CMOS process. They may be lateral transistors each having N-type source and drain regions constituting an N-channel MOSFET, formed by the CMOS process, as its collector and emitter and having a P-well base; or vertical transistors each having an N+ region constituting the source and drain regions of an N-channel MOSFET as its emitter, having the P-type well where it is formed as its base, and an N-type deep well for separating the P-type from a P-type substrate (PSUB) as its collector. In this way, a highly accurate reference voltage hardly affected by the offset of the CMOS differential amplifier circuit is obtained, and it is made possible to form the circuit by the CMOS process.

The reference voltage VRO is supplied, though not absolutely required, to the input terminal (−) of a differential amplifier circuit OP. The output signal of this differential amplifier circuit OP is communicated to the gate of a P-channel output MOSFET MP10. A stepped-down output voltage VDD is supplied from the drain of this P-channel MOSFET MP10. This output voltage VDD is divided by feedback resistors R7 and R8 disposed between the drain and the ground potential of the circuit, and the resultant divided voltages are inputted to the feedback terminal (+) of the differential amplifier circuit OP to form an output voltage VDD resulting from the amplification of the reference voltage VRO correspondingly to the ratio of voltage division.

In this embodiment, in order to add a switching function, a control signal/POFF is supplied to the gate of an N-channel MOSFET MN7 to which the operating current of the differential amplifier circuit OP is let flow. Further, a P-channel MOSFET MP9 is disposed between the gate of the P-channel output MOSFET MP10 and the source voltage VCC, and the control signal/POFF is supplied to the gate. One silicon band gap circuit, though not necessarily limited to one, to generate the reference voltage VRO is disposed in the semiconductor integrated circuit device, and the differential amplifier circuit OP and the output MOSFET MP10 are provided correspondingly to the circuit blocks 1, 2 and 4 having the power turning-off function.

When the source voltage VDD is to be supplied to a specific circuit block, the control signal/POFF is raised to the high level. The MOSFET MN7 is turned on, and an operating current is let flow to the differential amplifier circuit OP. On this occasion, the P-channel MOSFET MP9 is turned off. When the supply of the source voltage VDD to a specific circuit block is to be cut off, the control signal/POFF is lowered to the low level. This causes the MOSFET MN7 to be turned off, and the differential amplifier circuit OP is placed in a non-operating state. Then P-channel MOSFET MP9 is in an on state and the MOSFET MP10 securely turned off to cut off the source voltage VDD.

Figure 22:
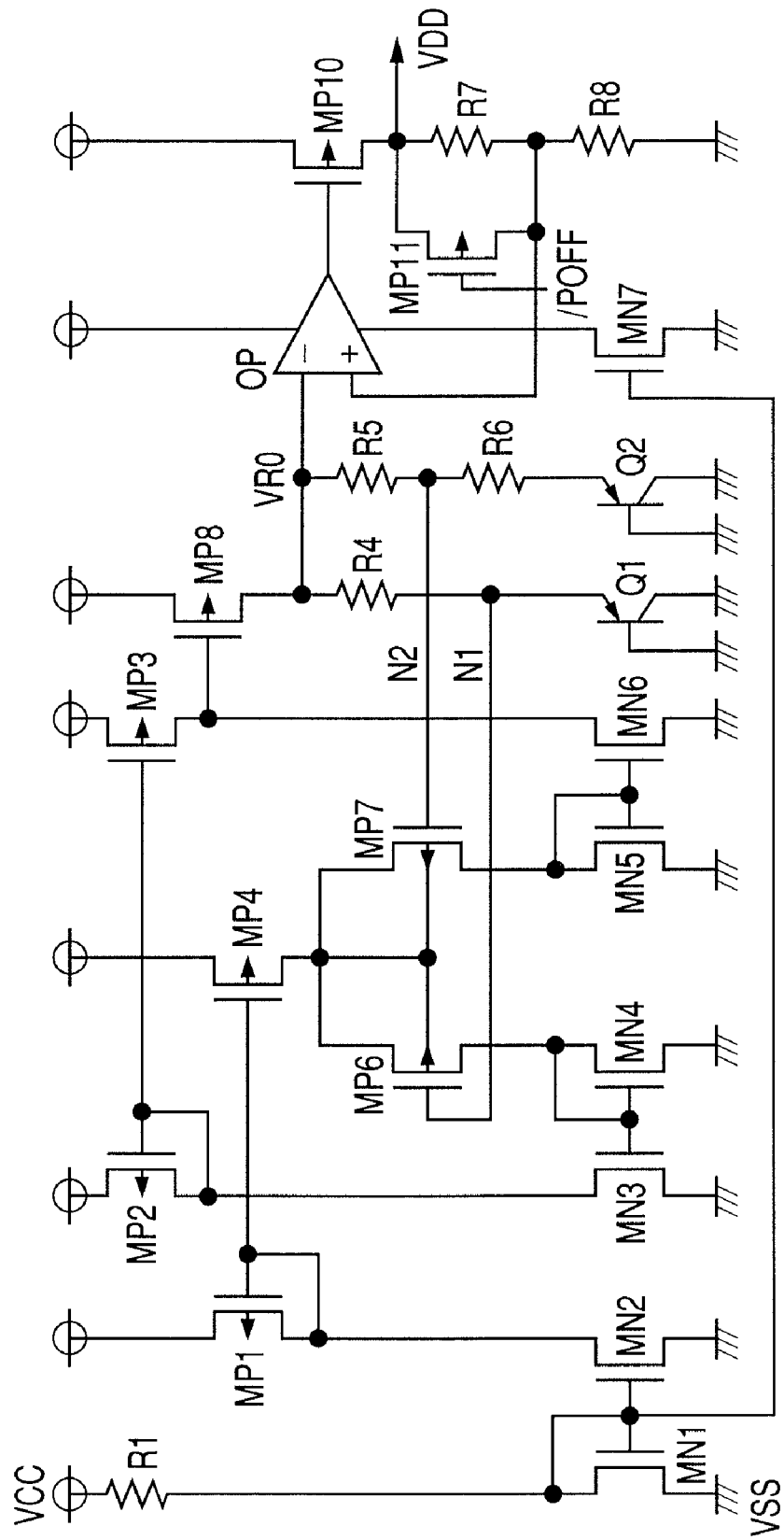
FIG. 22 is a circuit diagram of another example of step-down power supply circuit to be mounted on the semiconductor integrated circuit device pertaining to the invention.

FIG. 22 is a circuit diagram of another example of step-down power supply circuit to be mounted on the semiconductor integrated circuit device pertaining to the invention. This embodiment has a configuration in which, besides the configuration of the semiconductor integrated circuit device shown FIG. 3 or FIG. 15 wherein the low voltage VDD is supplied from the external terminal, a high voltage VCC is supplied from outside and reduced to VDD by the step-down power supply circuit illustrated therein and delivered to internal circuits. Further, a power switch function is added to this voltage step-down circuit. The power switch in this embodiment is not to cut off the source voltage VDD as in the foregoing embodiments, but is reduced to or below the lower voltage limit of the internal circuits.

Thus, a bias current is regularly supplied to the differential amplifier circuit OP by the N-channel MOSFET MN7. A P-channel MOSFET MP11 to short-circuit the two ends of the voltage dividing resistor R7 is disposed, though not absolutely required, to supply the aforementioned control signal/

POFF to its gate. In this configuration, the reduction of the control signal/POFF to the low level causes the two ends of the resistor R7 to be short-circuited to achieve 100% feedback of the output voltage VDD for operation as a voltage follower circuit. This reduces the source voltage VDD to a voltage matching the reference voltage VRO. The source voltage of the logical circuits is thereby reduced to or below the lower limit of the operating voltage, and this drop in voltage can help reduce the flowing leak current. As the operation of the logical circuits at or below the lower limit of the voltage may invite unfixed levels, there is provided an input circuit for preventing the propagation of unfixed levels as in the foregoing embodiments.

This power supply cut-off system enable a device having storage circuits, such as memories or registers, to retain the stored information while reducing the leak current from power supply. For static memory cells, registers using flip-flop circuits or latch circuits, if the purpose is simply to hold stored information, about half of that lower limit operation would suffice. Then, by significantly reducing the source voltage to a voltage level which meets the information holding purpose alone, the leak current can be reduced from circuit blocks to which power supply cannot be turned off as stated above. Where the reference voltage VRO is outputted as it is as in the embodiment shown in FIG. 22, the voltage cannot be reduced to around 1.1 V. Then, it is also possible to dispose a voltage dividing circuit on the input side of the differential amplifier circuit OP2 and divide the voltage VRO itself to reduce the source voltage VDD to the desired low level.

Referring to FIG. 21 and FIG. 22 above, instead of directly using the output voltage VDD of the MOSFET MP10 as the operating voltage for the circuit blocks, it can be used as the source voltage for the circuit blocks by using an output buffer of a voltage follower type. In this case, where a switching function is to be added as in the embodiment of FIG. 21, a power-off state can be forcibly achieved by cutting of the operating current of the output buffer and short-circuiting the gate and source of the output MOSFET. In this case, the operating current of the differential amplifier OP can also be cut off. Where the same stepped-down voltage VDD is to be used in a plurality of circuit blocks, the differential amplifier can be used in common, with an output buffer provided for each block. Where the output voltage is to be brought down to the lower limit of the operating voltage as in the configuration of FIG. 22 above, a silicon band gap circuit can be used in common, with each circuit block provided with an amplifier circuit having the aforementioned level switching function and an output circuit.

Figure 23:
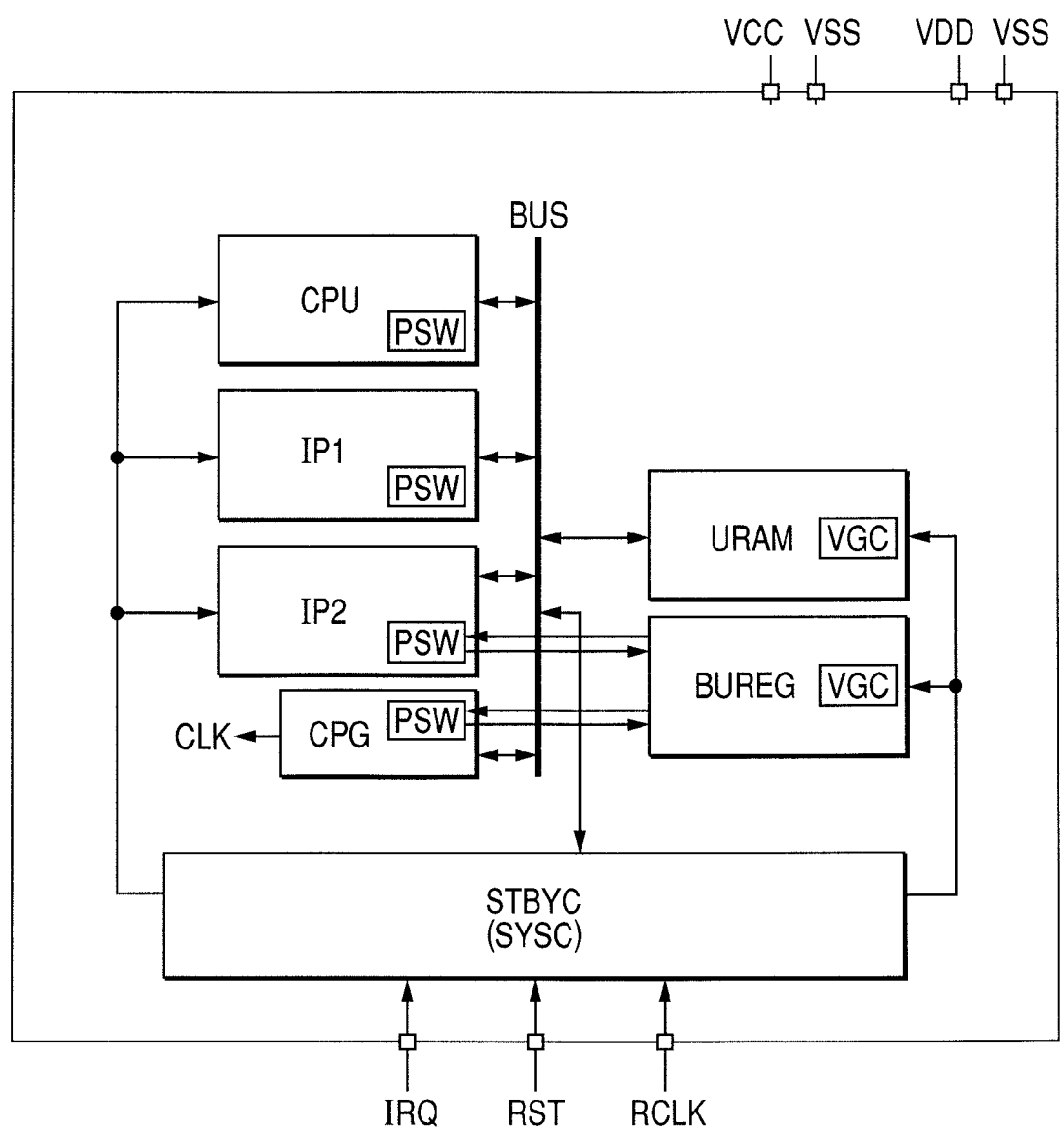
FIG. 23 is an overall block diagram of another example of semiconductor integrated circuit device pertaining to the invention.

FIG. 23 is an overall block diagram of another example of semiconductor integrated circuit device pertaining to the invention. This embodiment represents a conceptual configuration of the invention as applied to, for instance, an information processing device, in particular a system LSI (or microprocessor; the same applies hereinafter).

In the system LSI of this embodiment, each circuit block has a power switch PSW or VGC. The individual circuit block may be a central processing unit (CPU), peripheral circuit modules IP1 and IP2 or a clock generator circuit CPG, to each of which power supply is turned on and off with a power switch PSW. Other available circuit blocks include internal memories URAM and backup registers BUREG, each reducing the leak current while keeping the operation to hold stored information with a power switch VGC against the voltage drop as shown in FIG. 22. Power supply to a standby control circuit STBYC is on all the time, matches the circuit block 3 as in 14 above, and is provided with the power supply control circuit SYSC.

The CPU controls the system LSI as a whole. The peripheral circuit module IP1, though not limited to this function, is a peripheral circuit module which is not required when the CPU for an MPEG accelerator or the like fetches an instruction. The peripheral circuit module IP2, which may be a bus state controller or the like, is a peripheral circuit module which is required when the CPU fetches an instruction though not limited to this function. To the system bus BUS, various circuit modules including the CPU are connected, and includes a data bus and an address though not shown. The clock generator circuit CPG, receiving a clock signal RCLK, generates an internal clock signal ICLK. The internal clock signal ICLK is supplied to various circuit modules, and the system LSI operates in accordance with the internal clock signal ICLK. The URAM, a large-capacity internal memory, holds necessary information including data currently being processed. The backup register BUREG is used, when in the standby mode, for holding the values of register REG included in the peripheral circuit modules IP1 and IP2.

When a given program is to be executed by the system LSI, if there is a circuit block placed in the standby state, an instruction will be given to cut off power supply to or reduce the voltage for this circuit block. In advance of instructing a power supply cut-off or a voltage reduction, the control signal INC for preventing propagation of unfixed levels is generated and deliver to circuit blocks to which power supply is on. This serves to reduce the leak current in the circuit block to which power supply is turned off, and the circuits to which power supply is on and which are used for executing the program can perform, while preventing any through current from being generated by the input of any unfixed level, their signal processing operation matching the program without committing errors due to any unfixed level from the circuit block to which power supply is off. Further, when power supply to the CPU or peripheral circuit modules IP1 and IP2 is to be turned off, necessary internal information therein is saved into the. The URAM or the backup register BUREG holding such saved information can also be placed in the standby state with a voltage drop as described above it is no longer accessed.

Although the invention made by the present inventors has been hitherto described in specific terms with reference to some of the embodiments thereof, the invention is not confined to these embodiments, but various modifications are possible without deviating from its true spirit and scope. For instance, power switches can be disposed on the source voltage side of the circuit instead of the ground potential side as described above. Propagation of unfixed level scan as well be prevented by, instead of providing the micro I/O circuit with a gate circuit as in the embodiment shown in FIG. 4, providing the VCC-supplied logical circuit with an input circuit for preventing the propagation of unfixed levels as stated above. The circuit for preventing the propagation of unfixed levels can be, instead of using the latch circuit or logical gate circuits as described above, may forbid transmission of any unfixed level with a transmission gate MOSFET and providing a pull-up or pull-down MOSFET on the part of the signal-receiving circuit block. For instance, by using an N-channel MOSFET as the transmission gate MOSFET and the P-channel MOSFET as pull-up means, it is made possible to supply the control signal INC for preventing propagation of unfixed levels to the gate electrodes of the two MOSFETs. The invention can be extensively utilized in semiconductor integrated circuit devices each having a plurality of functional blocks such as microcomputers or system LSI.

What is claimed is:

1. A semiconductor integrated circuit device comprising:
a first circuit block;
a second circuit block; and
a third circuit block,
wherein the first circuit block has a first power supply state in which the operation of internal circuits thereof is guaranteed in accordance with a first instruction from the third circuit block and a second power supply state in which the operation of the internal circuits thereof is not guaranteed in accordance with a second instruction from the third circuit block,
wherein the second circuit block has an input unit which receives signals supplied from the first circuit block and the third circuit block, and
wherein the input unit of the second circuit block has an input circuit which, in accordance with a control signal sent from said third circuit block to said second circuit block, prohibits receipt of unfixed levels from the first circuit block and causes a fixed level signal to be transmitted to internal circuits of the second circuit block in compliance with the operating voltage of the second circuit block irrespective of the signal supplied from the first circuit block to the second circuit block when the third circuit block instructs the second power supply state to the first circuit block by sending the second instruction to the first circuit block,
wherein the third circuit block includes an input circuit to receive a standby signal and a clock signal comprised of a series of clock pulses, wherein the third circuit block operates to generate the control signal to transmit to the second circuit block after the third circuit block receives the standby signal, wherein the third circuit block also generates the second instruction to the first circuit block after the third circuit block receives the standby signal, and
wherein the third circuit block generates the control signal for the second circuit block before it generates the second instruction for the first circuit block.

* * * * *